United States Patent
Sung

(10) Patent No.: US 11,355,672 B2
(45) Date of Patent: Jun. 7, 2022

(54) SEMICONDUCTOR DEVICE

(71) Applicant: SUZHOU LEKIN SEMICONDUCTOR CO., LTD., Taicang (CN)

(72) Inventor: Youn Joon Sung, Seoul (KR)

(73) Assignee: SUZHOU LEKIN SEMICONDUCTOR CO., LTD., Taicang (CN)

(*) Notice: Subject to any disclaimer, the term of this patent is extended or adjusted under 35 U.S.C. 154(b) by 676 days.

(21) Appl. No.: 16/068,091

(22) PCT Filed: Jan. 4, 2017

(86) PCT No.: PCT/KR2017/000091
§ 371 (c)(1),
(2) Date: Jul. 3, 2018

(87) PCT Pub. No.: WO2017/119711
PCT Pub. Date: Jul. 13, 2017

(65) Prior Publication Data
US 2020/0395505 A1  Dec. 17, 2020

(30) Foreign Application Priority Data

Jan. 5, 2016 (KR) .................. 10-2016-0000795
Jan. 6, 2016 (KR) .................. 10-2016-0001417

(51) Int. Cl.
*H01L 33/24* (2010.01)
*H01L 33/38* (2010.01)
(Continued)

(52) U.S. Cl.
CPC .............. *H01L 33/24* (2013.01); *H01L 33/38* (2013.01); *H01L 33/44* (2013.01); *H01L 33/62* (2013.01)

(58) Field of Classification Search
None
See application file for complete search history.

(56) References Cited

U.S. PATENT DOCUMENTS 6,606,335 B1  8/2003  Kuramata et al.
7,781,242 B1  8/2010  Chen et al.
(Continued)

FOREIGN PATENT DOCUMENTS

CN   101286542 A   10/2008
CN   102376834 A    3/2012
(Continued)

OTHER PUBLICATIONS

International Search Report (with English Translation) and Written Opinion dated Apr. 18, 2017 issued in Application No. PCT/KR2017/000091.

(Continued)

*Primary Examiner* — Anthony Ho
(74) *Attorney, Agent, or Firm* — Birch, Stewart, Kolasch & Birch, LLP

(57) ABSTRACT

One embodiment comprises: a semiconductor substrate; a pattern layer disposed on the semiconductor substrate and comprising a plurality of patterns that are spaced apart from each other; a nitride semiconductor layer disposed on the pattern layer; and a semiconductor substrate disposed on the nitride semiconductor layer and comprising a first conductive semiconductor layer, an active layer, and a second conductive semiconductor layer, wherein the thermal conductivity of the pattern layer is higher than the thermal conductivity of the semiconductor substrate and the thermal conductivity of the semiconductor structure.

20 Claims, 19 Drawing Sheets

(51) Int. Cl.
*H01L 33/44* (2010.01)
*H01L 33/62* (2010.01)

(56) References Cited

U.S. PATENT DOCUMENTS

| | | | |
|---|---|---|---|
| 9,147,807 | B1 | 9/2015 | Yamada et al. |
| 9,214,604 | B2 | 12/2015 | Ali et al. |
| 10,230,018 | B2 | 3/2019 | Hao et al. |
| 2006/0176924 | A1 | 8/2006 | Kim et al. |
| 2007/0295951 | A1* | 12/2007 | Chyi ................ H01L 33/20 257/14 |
| 2011/0278613 | A1 | 11/2011 | Tu et al. |
| 2012/0156815 | A1 | 6/2012 | Huang et al. |
| 2014/0070372 | A1 | 3/2014 | Yoon et al. |
| 2014/0167066 | A1* | 6/2014 | Kashima ............ H01L 33/44 257/76 |
| 2015/0221827 | A1 | 8/2015 | Crowder et al. |
| 2015/0287882 | A1 | 10/2015 | Yamada et al. |
| 2015/0357522 | A1* | 12/2015 | Yamada ......... H01L 33/0075 257/99 |

FOREIGN PATENT DOCUMENTS

| | | |
|---|---|---|
| CN | 104795474 A | 7/2015 |
| JP | H10-312971 | 11/1998 |
| JP | 11-145516 A | 5/1999 |
| JP | 11-274642 A | 10/1999 |
| JP | 2001-156403 A | 6/2001 |
| JP | 2001-177146 A | 6/2001 |
| JP | 2006-216961 A | 8/2006 |
| JP | 2007-116097 A | 5/2007 |
| JP | 2009-71174 A | 4/2009 |
| JP | 2010-98068 A | 4/2010 |
| JP | 2010-141369 | 6/2010 |
| JP | 2012-023249 | 2/2012 |
| JP | 2012-134499 | 7/2012 |
| JP | 2014-519188 A | 8/2014 |
| JP | 2015-207752 A | 11/2015 |
| KR | 10-1999-0088667 | 12/1999 |
| KR | 10-2007-0033900 A | 3/2007 |
| KR | 10-2011-0073039 | 6/2011 |
| KR | 10-2012-0135787 A | 12/2012 |
| KR | 10-2013-0111031 A | 10/2013 |
| KR | 10-2014-0009692 | 1/2014 |
| KR | 10-2015-0113525 | 10/2015 |
| WO | WO 2012/093601 | 7/2012 |
| WO | WO 2015/067183 A1 | 5/2015 |

OTHER PUBLICATIONS

European Search Report dated Nov. 21, 2018 issued in Application No. 17736084.9.

* cited by examiner

| Material | Thermal Conductivity [W/m·K] | Refractive Index | CTE [10-6 / K] |
|---|---|---|---|
| $SiO_2$ | 2.13 | 1.46 | 0.55 |
| AlN | 285 | 2.18 | 4.2 |
| $Al_2O_3$ | 30 | 1.78 | 6.7 |
| GaN | 130 | 2.43 | 5.3 |

SEMICONDUCTOR DEVICE

CROSS-REFERENCE TO RELATED PATENT APPLICATIONS

This application is a U.S. National Stage Application under 35 U.S.C. § 371 of PCT Application No. PCT/KR2017/000091, filed Jan. 4, 2017, which claims priority to Korean Patent Application No. 10-2016-0000795, filed Jan. 5, 2016, and Korean Patent Application No. 10-2016-0001417, filed Jan. 6, 2016, whose entire disclosures are hereby incorporated by reference.

TECHNICAL FIELD

Embodiments relate to a semiconductor device.

BACKGROUND ART

A substrate for growing a nitride material in a nitride semiconductor device mainly uses a sapphire substrate. That is, the nitride material, for example, gallium nitride (GaN), is epitaxially grown on the sapphire substrate to manufacture a light emitting device, for example, a light emitting diode (LED). Due to sturdiness and capability to endure high temperatures, the sapphire substrate is suitable for high-temperature epitaxial growth but includes a large quantity of crystalline defects caused by heterogeneous materials.

To reduce such crystalline defects, a semiconductor substrate may be used as a substrate for epitaxial growth of a nitride semiconductor. The semiconductor substrate may use a GaN substrate.

An optical device using the nitride semiconductor is being applied to a variety of products, such as a backlight or keypad of a cellular phone, an electronic display board, and a lighting apparatus, as a light source. Particularly, as digital products have evolved, demand for optical devices using the nitride semiconductor having high luminance and high reliability has increased.

Moreover, when a light receiving device such as a photodetector or a solar cell is manufactured using Group III-V or II-VI compound semiconductor materials, since the light receiving device generates photocurrent by absorbing light of various wavelength ranges due to development of materials for the device, light of various wavelengths from gamma rays to radio waves may be used. In addition, due to advantages of rapid response speed, safety, environmental friendliness, and easy adjustment of device materials, the nitride semiconductor may be easily used for a power control circuit, an ultra-high frequency circuit, or a communication module.

Thus, the semiconductor device has been increasingly applied to a transmission module of an optical communication means, an LED backlight which replaces a cold cathode fluorescence lamp (CCFL) constituting a backlight of a liquid crystal display (LCD) device, a white LED lighting apparatus which replaces a fluorescent lamp or an incandescent lamp, a head lamp of a vehicle, and a sensor for sensing gas or fire. The semiconductor device may also be applied up to a high frequency application circuit, a power control apparatus, and a communication module.

SUMMARY

Embodiments provide a semiconductor device capable of improving a heat dissipation effect and preventing deterioration of light emitting efficiency caused by increase in temperature.

In one embodiment, a semiconductor device includes a semiconductor substrate; a pattern layer disposed on the semiconductor substrate, the pattern layer including a plurality of patterns separated from each other; a nitride semiconductor layer disposed on the pattern layer; and a semiconductor structure disposed on the nitride semiconductor layer, the semiconductor structure including a first conductivity-type semiconductor layer, an active layer, and a second conductivity-type semiconductor layer, wherein a thermal conductivity of the pattern layer is higher than a thermal conductivity of the semiconductor substrate and a thermal conductivity of the semiconductor structure.

A planar shape of an upper surface of the semiconductor structure may be a triangle having a first side, a second side, and a third side, an angle between the first side and the second side may be a first angle, an angle between the first side and the third side may be a second angle, an angle between the second side and the third side may be a third angle, the first angle may be a right angle, and the second or third angle may be 25° to 65°.

A shape of an upper surface of the semiconductor structure may be a right triangle including a first side, a second side, and a third side, a ratio of a first perimeter to a second perimeter may be 1.1 to 1.25, the first perimeter may be the sum of the first side, the second side, and the third side, and the second perimeter may be a perimeter of an equilateral triangle having the same area as an area of the upper surface of the semiconductor structure.

The pattern layer may be an aluminum nitride (AlN) layer.

The plural patterns may have stripe shapes, a width of each of the plural patterns may be 10 µm to 20 µm, and a distance between the plural patterns may be 2 µm to 4 µm.

Each of the plural patterns may have a discoid shape or a polyhedral shape, a diameter of each of the plural patterns may be 2 µm to 5 µm, and a distance between the plural patterns may be 0.4 µm to 1.5 µm.

A width and a diameter of each of the plural patterns may decrease in a vertical direction and the vertical direction may be a direction of the semiconductor structure from the semiconductor substrate.

The pattern layer may be a light transmissive insulating material.

The pattern layer may include first to n-th patterns from a center of the semiconductor substrate to an edge of the semiconductor substrate, each of the first to n-th patterns may have a ring shape, and an (n−1)-th pattern may be disposed at an upper surface of the semiconductor substrate located inside an inner circumference surface of the n-th pattern.

An area occupied by the pattern layer relative to an entire area of the upper surface of the semiconductor substrate may be 70% or more.

Advantageous Effects

Embodiments provide a semiconductor device capable of improving a heat dissipation effect and preventing deterioration of light emitting efficiency caused by increase in temperature.

DETAILED DESCRIPTION

Hereinafter, the embodiments will be clearly appreciated through the accompanying drawings and the following description thereof. In describing the embodiments, it will be understood that, when an element such as a layer (film), region, pattern or structure is referred to as being formed "on" or "under" another element, such as a substrate, layer (film), region, pad or pattern, it can be directly "on" or "under" the other element or be indirectly formed with intervening elements therebetween. It will also be understood that "on" or "under" the element may be described relative to the drawings.

A semiconductor device may include a variety of electronic devices such as a light emitting device and a light receiving device each including a first conductivity-type semiconductor layer, an active layer, and a second conductivity-type semiconductor layer.

For example, a semiconductor device according to an embodiment may be a light emitting device. The light emitting device emits light through recombination of electrons and holes. The wavelength of the light is determined by an energy bandgap specific to materials. Accordingly, the emitted light may vary with composition of the materials.

Figure 1:
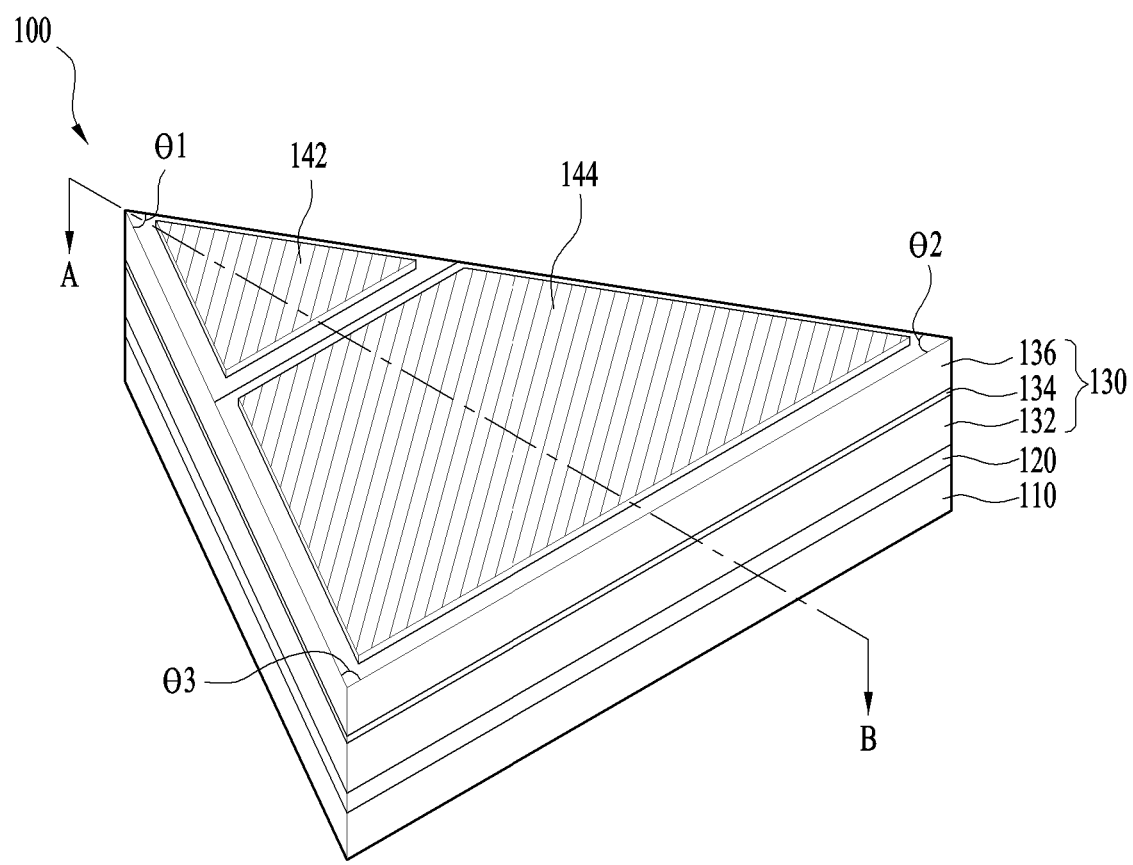
FIG. 1 is a perspective view of a semiconductor device according to an embodiment.
Figure 2:
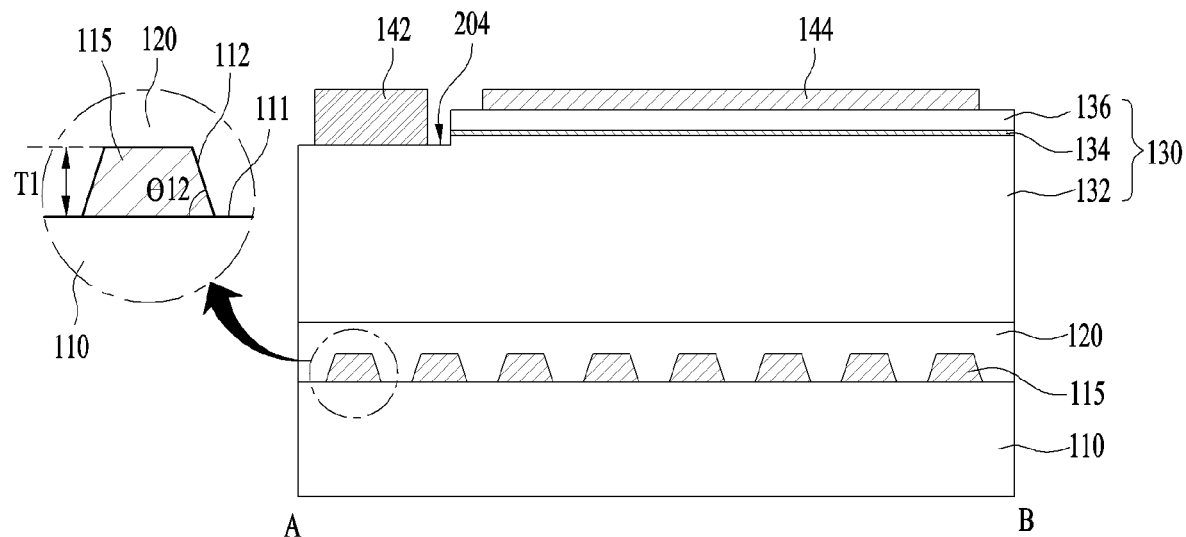
FIG. 2 is a sectional view of the semiconductor device taken along line A-B shown in FIG. 1.

FIG. 1 is a perspective view of a semiconductor device 100 according to an embodiment. FIG. 2 is a sectional view of the semiconductor device 100 taken along line A-B shown in FIG. 1.

Referring to FIGS. 1 and 2, the semiconductor device 100 includes substrate 110, a pattern layer 115, a nitride semiconductor layer 120, a semiconductor structure 130, a first electrode 142, and a second electrode 144.

The substrate 110 may be a nitride semiconductor substrate. For example, the substrate 110 may be comprised of a semiconductor having a composition of $Al_xGa_{1-x}N$ (0≤x≤0.5).

For instance, the substrate 110 may include at least one of a GaN layer or an AlGaN layer and may be formed as a single layer or multiple layers. The substrate 110 may be a light transmissive substrate.

To raise the ratio of light extracted from the lateral surface of the substrate 110, the shape of the substrate 110 may be a pentahedron, for example, a triangular prism, but embodiments are not limited thereto. In other embodiments, the shape of the substrate 110 may be a hexahedron, for example, a rectangular prism.

For example, an internal angle θ1, θ2, or θ3 between two adjacent sides of the substrate 110 may be an acute angle, for example, 45° or 60°.

The pattern layer 115 is disposed at an upper surface 111 of the substrate 110. The pattern layer 115 may serve to emit heat of the substrate 110 and the semiconductor structure 120 or conduct heat between the semiconductor structure and the substrate.

That is, the pattern layer 115 may be disposed between the substrate 110 and the semiconductor structure 130 to improve thermal conductivity of the semiconductor device 100.

The thermal conductivity of the pattern layer 115 may be higher than the thermal conductivity of the substrate 110.

The thermal conductivity of the pattern layer 115 may also be higher than the thermal conductivity of the semiconductor structure 130.

The pattern layer 115 may be formed of a light transmissive material so as not to reduce light extraction efficiency and may be formed of an insulating material.

If the pattern layer 115 is formed of a non-light-transmissive material, for example, a non-light-transmissive metallic material, light generated by the semiconductor structure 130 may be absorbed into the pattern layer 115 or reflected from the pattern layer 115 and, thus, light extraction efficiency of the semiconductor device is reduced.

To prevent the crystalline quality of the semiconductor structure 130 from deteriorating, the pattern layer 115 may be formed of a material having a coefficient of thermal expansion similar to that of the semiconductor structure 130.

For example, to improve crystalline quality of the semiconductor structure 130, the difference between the coefficient of thermal expansion of the pattern layer 115 and the coefficient of thermal expansion of the semiconductor structure 130 may be less than 2.5 but embodiments are not limited thereto.

For example, the pattern layer 115 may be formed of aluminum nitride (AlN) but embodiments are not limited thereto.

Figures 9, 10A:
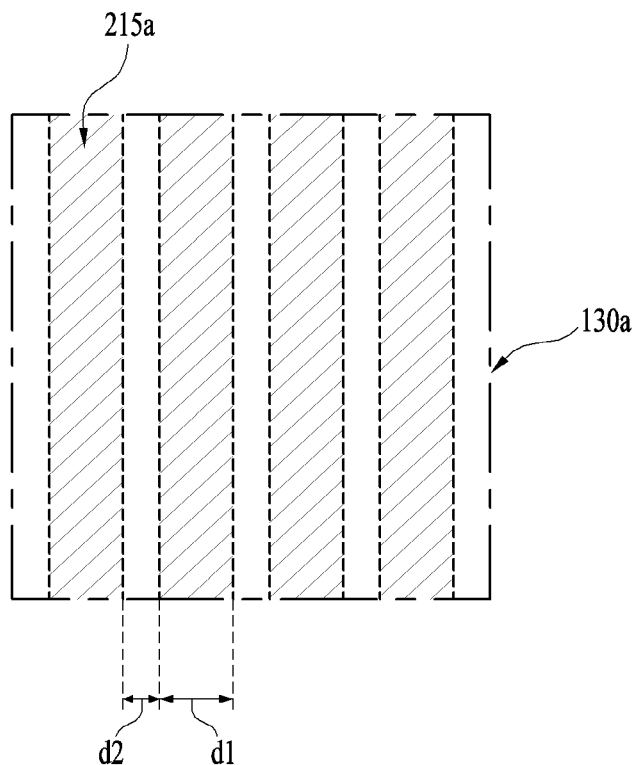
FIG. 9 illustrates thermal conductivities and coefficients of thermal expansion (CTEs) of the AlN pattern layer 115 and other light transmissive materials.
FIGS. 10A to 10D illustrate pattern layers of a semiconductor device according to other embodiments.

FIG. 9 illustrates thermal conductivities and coefficients of thermal expansion (CTEs) of the AlN pattern layer 115 and other light transmissive materials.

Referring to FIG. 9, the thermal conductivity (285 [W/m·k]) of the AlN pattern layer 115 is higher than the thermal conductivities of other light transmissive materials, for example, $SiO_2$ and $Al_2O_3$. The thermal conductivity of the AlN pattern layer 115 is also higher than the thermal conductivity (130[W/m·k]) of the substrate 110 including gallium nitride (GaN).

The difference between the CTE ($4.2[10^{-6}/K]$) of the AlN pattern layer 115 and the CTE ($5.3[10^{-6}/K]$) of the substrate 110 including GaN is less than the difference between the CTE of another light transmissive material, for example, $SiO_2$ or $Al_2O_3$, and the CTE of the substrate 110.

The pattern layer 115 may be formed by depositing a pattern layer formation material, for example, AlN, at the upper surface 111 of the substrate 110 and then patterning the deposited material, for example, AlN, through a photolithography process and an etching process.

A thickness T1 of the pattern layer 115 may be 0.5 μm to 3 μm or less.

When the thickness T1 of the pattern layer 115 exceeds 3 μm, a desired shape of the pattern cannot be obtained because of the difficulty of the patterning process and a growth time of the nitride semiconductor layer 120 and the semiconductor structure 130 may increase.

When the thickness T1 of the pattern layer 115 is less than 0.5 μm, there may be no remarkable thermal conduction effect and heat dissipation effect.

For example, according to another embodiment, in order to secure a stable shape of the pattern layer 115 and to stably guarantee the thermal conduction effect and the heat dissipation effect, the thickness T1 of the pattern layer 115 may be 1 μm to 2 μm.

For example, according to still another embodiment, in order to more stably guarantee the thermal conduction effect and the heat dissipation effect, the thickness T1 of the pattern layer 115 may be 2.5 μm to 3 μm.

A side surface 112 of the pattern layer 115 may be an inclined surface which slopes based on the upper surface 111 of the substrate 110 by the patterning process through etching. For example, an internal angle θ12 between the side surface 112 of the pattern layer 115 and a lower surface of the pattern layer 115 may be less than 90° but embodiments are not limited thereto.

The pattern layer 115 may gradually decrease in width or diameter in a vertical direction. For example, each of patterns 115a to 115d shown in FIGS. 3 to 6 may gradually decrease in width or diameter in a vertical direction.

Herein, the vertical direction may be a direction of the semiconductor structure 130 from the substrate 110, i.e., a direction which is perpendicular to the upper surface 111 of the substrate 110.

Figure 3:
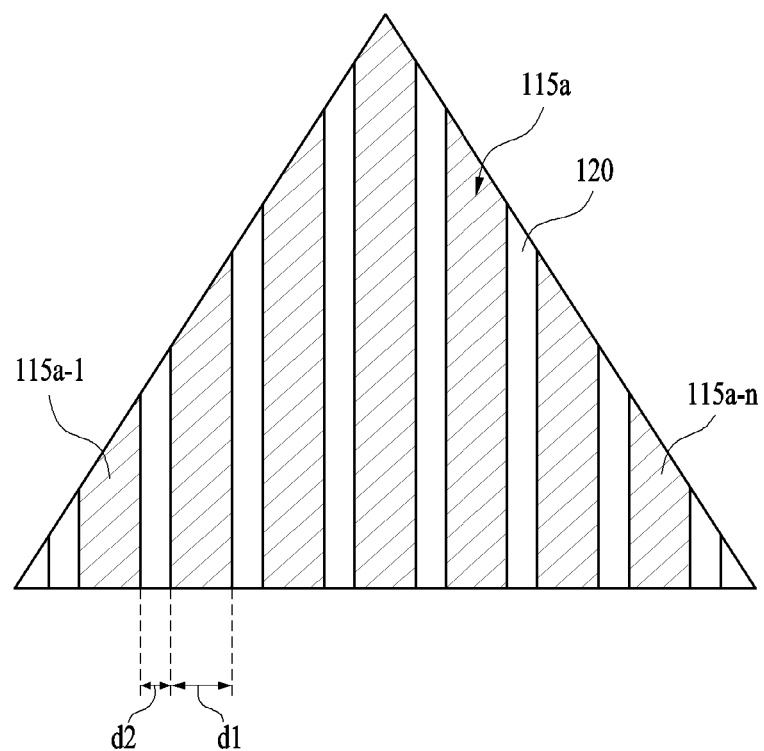
FIG. 3 illustrates an embodiment of a pattern layer shown in FIG. 2.

FIG. 3 illustrates an embodiment 115a of the pattern layer 115 shown in FIG. 2.

Referring to FIG. 3, the pattern layer 115a includes a plurality of separated patterns 115a-1 to 115a-n (where n is a natural number greater than 1). For example, each the plural patterns 115a-1 to 115a-n may have a line shape or a rectangular parallelepiped shape. Each of the plural patterns 115a-1 to 115a-n may have a stripe shape.

The ratio of a distance d2 between the patterns 115a-1 to 115a-n to a width d1 of each of the patterns 115a-1 to 115a-n, i.e., d2:d1, may be 1:2.5 to 1:10.

For example, the width d1 of each of the patterns 115a-1 to 115a-n may be 10 μm to 20 μm and the distance d2 between the patterns 115a-1 to 115a-n may be 2 μm to 4 μm.

In this case, the distance d2 may be the width of one area of the top surface of the substrate 110 exposed between the patterns 115a-1 to 115a-n.

When the width d1 of each of the patterns 115a-1 to 115a-n is less than 10 μm, this has little effect on heat dissipation and thermal conductivity increase so that optical output efficiency and external quantum efficiency of the semiconductor device are hardly improved.

When the width d1 of each of the patterns 115a-1 to 115a-n exceeds 20 μm, it is difficult to grow the semiconductor structure 130 on the pattern layer 115a or it takes a long time to grow the semiconductor structure 130.

In other embodiments, in order to raise the heat dissipation effect and the thermal conductivity increase effect and to simultaneously enable easy growth of the semiconductor structure 130, the width d1 of each of the patterns 115a-1 to 115a-n may be 14 μm to 16 μm.

In other embodiments, in order to more easily grow the semiconductor structure 130 and to raise a growth rate, the width d1 of each of the patterns 115a-1 to 115a-n may be 10 μm to 14 μm.

In other embodiments, in order to obtain the heat dissipation effect and the thermal conductivity increase effect rather than easily growing the semiconductor structure, the width d1 of each of the patterns 115a-1 to 115a-n may be 16 μm to 20 μm.

When the distance d1 between the patterns 115a-1 to 115a-n is less than 2 μm, it is difficult to grow the semiconductor structure 130 on the pattern layer 115a or it takes a long time to grow the semiconductor structure 130.

When the distance d1 between the patterns 115a-1 to 115a-n exceeds 4 μm, since the width of each pattern becomes narrow, there is little effect on heat dissipation and thermal conductivity increase so that the optical output efficiency and external quantum efficiency of the semiconductor device are hardly improved.

For example, in other embodiments, in order to improve optical output efficiency by securing the heat dissipation effect and the thermal conductivity increase effect, an area occupied by the patterns 115a-1 to 115a-n of the pattern layer 115a relative to the entire area of the upper surface 111 of the substrate 110 may be 70% or more.

In addition, for example, in order to enable the semiconductor structure to grow on the patterns 115a-1 to 115a-n and to prevent a growth time of the semiconductor structure from taking long, the area occupied by the patterns 115a-1 to 115a-n of the pattern layer 115a relative to the entire area of the upper surface 111 of the substrate 110 may be 95% or less.

Figure 4:
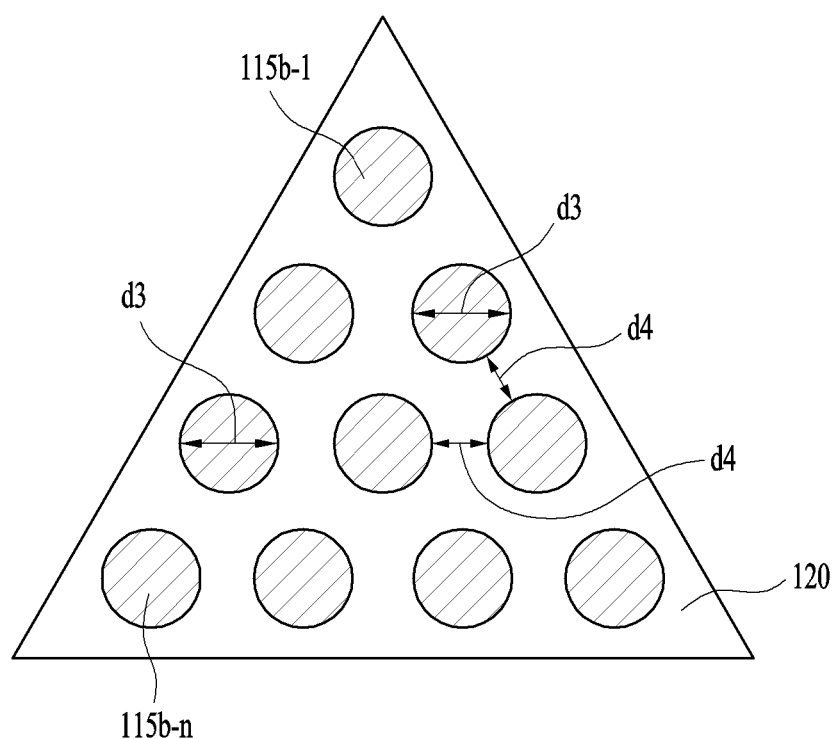
FIG. 4 illustrates another embodiment of the pattern layer shown in FIG. 2.

FIG. 4 illustrates another embodiment 115b of the pattern layer 115 shown in FIG. 2.

Referring to FIG. 4, the pattern layer 115b may include a plurality of separated patterns 115b-1 to 115b-n (where n is a natural number greater than 1). Each of the plural patterns 115b-1 to 115b-n shown in FIG. 4 may have a circular, cylindrical, or discoid shape.

A diameter d3 of each of the plural patterns 115b-1 to 115b-n shown in FIG. 4 may be 2 μm to 5 μm. A distance d4 between the plural patterns 115b-1 to 115b-n may be 0.4 μm to 1.5 μm.

When the diameter d3 of each of the patterns 115b-1 to 115b-n is less than 2 μm, this has little effect on heat dissipation and thermal conductivity increase so that optical output efficiency and external quantum efficiency of the semiconductor device are hardly improved. For example, in order to stably guarantee the heat dissipation effect and the thermal conductivity increase effect, the diameter d3 may be 3 μm to 4 μm.

When the diameter d3 of each of the patterns 115*b*-1 to 115*b*-*n* is exceeds 5 μm, it is difficult to grow the semiconductor structure 130 on the pattern layer 115*b* and it takes a long time to grow the semiconductor structure 130. For example, in order to stably grow the semiconductor structure 130 and to secure a proper growth time, the distance d4 may be 0.6 μm to 1 μm.

For example, in other embodiments, in order to stably guarantee improvement in optical output efficiency due to the heat dissipation effect and the thermal conductivity increase effect and to secure stable growth and a proper growth time of the semiconductor structure 130, an area occupied by the patterns 115*b*-1 to 115*b*-*n* of the pattern layer 115*a* relative to the entire area of the upper surface 111 of the substrate 110 may be 40% or more.

In addition, for example, in order to enable the semiconductor structure to grow on the patterns 115*b*-1 to 115*b*-*n* and to prevent a growth time of the semiconductor structure from taking long, the area occupied by the patterns 115*b*-1 to 115*b*-*n* of the pattern layer 115*a* relative to the entire area of the upper surface 111 of the substrate 110 may be 95% or less.

Figure 5:
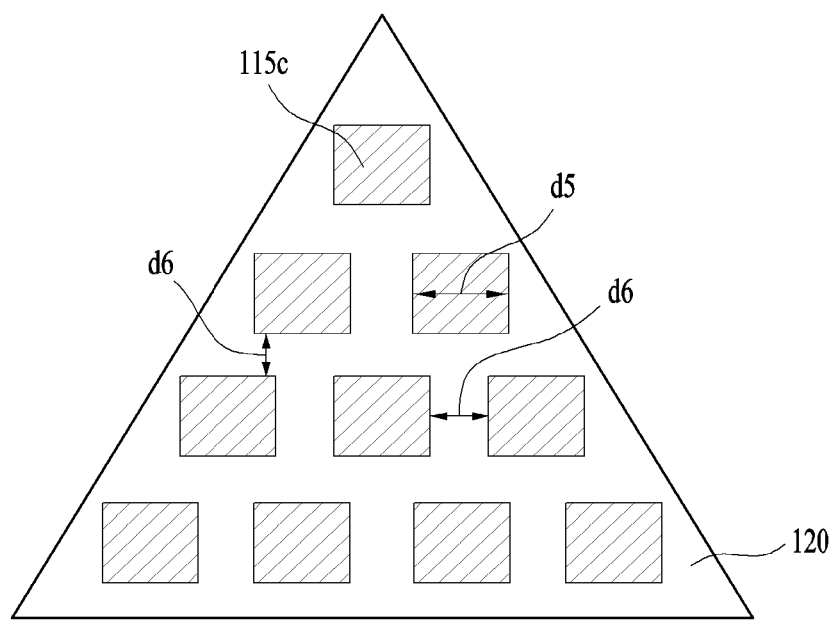
FIG. 5 illustrates another embodiment of the pattern layer shown in FIG. 2.

FIG. 5 illustrates another embodiment 115*c* of the pattern layer 115 shown in FIG. 2.

Referring to FIG. 5, the pattern layer 115*c* may include a plurality of separated patterns 115*c*-1 to 115*c*-*n* (where n is a natural number greater than 1). The shape of each of the plural patterns 115*c*-1 to 115*c*-*n* may be a polygon (e.g., a rectangle) or a polyhedron (e.g., a hexahedron).

A description given with respect to the diameter d3 in FIG. 4 may be equally applied to a diameter d5 of each of the plural patterns 115*c*-1 to 115*c*-*n* shown in FIG. 5 and a description given with respect to the distance d4 in FIG. 4 may be equally applied to a distance d6 between the plural patterns 115*c*-1 to 115*c*-*n* shown in FIG. 5.

For example, in other embodiments, in order to improve optical output efficiency by securing the heat dissipation and the thermal conductivity increase effect, an area occupied by the pattern layer 115*c* relative to the entire area of the upper surface 111 of the substrate 110 may be 40% or more. In addition, for example, the area occupied by the patterns of the pattern layer 115*c* relative to the entire area of the upper surface 111 of the substrate 110 may be 95% or less.

Figure 6:
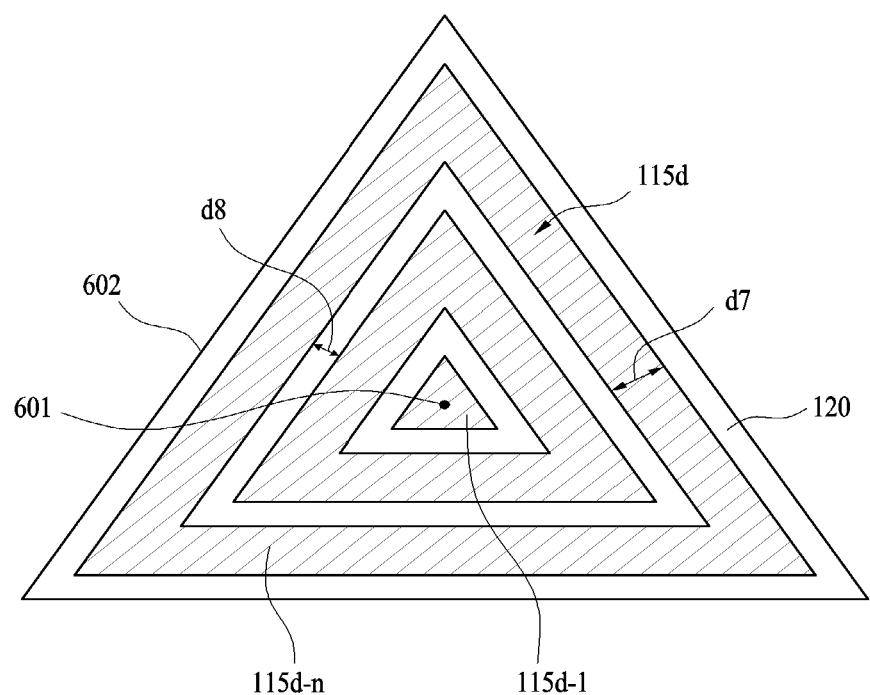
FIG. 6 illustrates another embodiment of the pattern layer shown in FIG. 2.

FIG. 6 illustrates another embodiment 115*d* of the pattern layer 115 shown in FIG. 2.

Referring to FIG. 6, the pattern layer 115*d* may include a plurality of separated patterns 115*d*-1 to 115*d*-*n* (where n is a natural number greater than 1).

For example, the pattern layer 115*d* includes first to n-th patterns 115*d*-1 to 115*d*-*n* which are sequentially arranged in the direction of an edge 602 from a center 601 of the substrate 110. Each of the first to n-th patterns 115*d*-1 to 115*d*-*n* has a ring shape. The (n−1)-th pattern 115*d*-(*n*−1) is located inside an inner circumferential surface of the n-th pattern 115*d*-*n*.

Each of the first to n-th patterns 115*d*-1 to 115*d*-*n* (where n is a natural number greater than 1) may have a polygonal shape, for example, a triangular ring shape. Although a triangular ring shape which is the same as the shape of the substrate 110 is shown in FIG. 6, embodiments are not limited thereto and may have a rectangular or pentagonal shape.

The shape of an outer circumferential surface of each of the first to n-th patterns 115*d*-1 to 115*d*-*n* (where n is a natural number greater than 1) may be the same as the shape of an outer circumferential surface of the substrate 110.

The shortest distance of each of the first to n-th patterns 115*d*-1 to 115*d*-*n* (where n is a natural number greater than 1) from the center 601 of the substrate 110 in a direction of the edge 602 of the substrate 110 may increase.

Herein, the shortest distance may be the shortest separated distance from the center 601 of the substrate 110 to the outer circumferential surface of each of the first to n-th patterns 115*d*-1 to 115*d*-*n* (where n is a natural number greater than 1).

A description given with respect to the diameter d3 in FIG. 4 may be equally applied to a diameter or width d7 of each of the patterns 115*d*-1 to 115*d*-*n* in FIG. 6 and a description given with respect to the distance d4 in FIG. 4 may be equally applied to a distance d8 between the patterns 115*d*-1 to 115*d*-*n*.

For example, in other embodiments, in order to improve optical output efficiency by simultaneously securing the heat dissipation and the thermal conductivity increase effect, an area occupied by the patterns 115*d*-1 to 115*d*-*n* of the pattern layer 115*d* relative to the entire area of the upper surface 111 of the substrate 110 may be 70% or more. In addition, for example, the area occupied by the patterns of the pattern layer 115*d* relative to the entire area of the upper surface 111 of the substrate 110 may be 95% or less.

In FIG. 6, each of the patterns 115*d*-1 to 115*d*-*n* (where n is a natural number greater than 1) has the same shape as the outer circumferential surface of the substrate 110 but embodiments are not limited thereto. In other embodiments, each of the patterns 115*d*-1 to 115*d*-*n* (where n is a natural number greater than 1) may have a shape different from the outer circumferential surface of the substrate 110.

A description given with respect to the thickness T1 of the pattern layer 115 in FIG. 2 may be equally applied to the thickness of each of the pattern layers 115*a* to 115*d* according to embodiments of FIGS. 3 to 6.

In order to sufficiently perform heat dissipation and thermal conduction, the pattern layer 115 should be formed of a material which is not melted at a regrowth temperature of the nitride semiconductor layer 120.

After the pattern layer 150 is formed on the substrate 110, the nitride semiconductor layer 120 is grown at a high temperature of 1000° C. or more on the substrate 110 on which the pattern layer 115 is formed. If the pattern layer 115 is melted in a process of growing the nitride semiconductor layer 120, a desired shape and size (e.g., a desired width and thickness) of the pattern layer cannot be guaranteed. Then, an effect of improvement in optical extraction efficiency caused by the heat dissipation effect and the thermal conductivity increase effect cannot be obtained.

The nitride semiconductor layer 120 is formed on the pattern layer 115 and the substrate 110.

For example, a space between the patterns of the pattern layer 115 may be filled with the nitride semiconductor layer 120 and the nitride semiconductor layer 120 may cover the pattern layer 115.

The nitride semiconductor layer 120 may be formed of the same material as the substrate 110. For example, the nitride semiconductor layer 120 may have the same composition, for example, the same constituent components and the same content ratio between the constituent components, as the substrate 110, but embodiments are not limited thereto. In other embodiments, the nitride semiconductor layer 120 may be formed of a different material from the substrate 110. Alternatively, in other embodiments, the nitride semiconductor layer 120 may have the same constituent components as the substrate 110 but may have a different content ratio from the substrate 110.

The nitride semiconductor layer 120 may serve as a buffer layer to prevent crystalline defects caused by lattice mismatch by relieving the difference in lattice coefficient between the substrate 110 and the semiconductor structure 130.

When the nitride semiconductor layer 120 includes the same material as the substrate 110, for example, GaN or AlGaN, both the substrate 110 and the nitride semiconductor layer 120 may be defined as the nitride semiconductor layer. The pattern layer 115 may be disposed inside the nitride semiconductor layer 110 and 120. The plural patterns may be separately arranged in parallel in a horizontal direction.

The semiconductor structure 130 is disposed on the nitride semiconductor layer 120.

The semiconductor structure 130 may include a first conductivity-type semiconductor layer 132, an active layer 134, and a second conductivity-type semiconductor layer 136, which are sequentially deposited on the nitride semiconductor layer 120.

The first conductivity-type semiconductor layer 132 may be a Group III-V or Group II-VI compound semiconductor, for example, a semiconductor having a composition of $In_xAl_yGa_{1-x-y}N$ ($0 \leq x \leq 1$, $0 \leq y \leq 1$, and $0 \leq x+y \leq 1$) and may be doped with an n-type dopant (e.g., Si, Ge, Se, or Te).

The active layer 134 may generate light by energy created during recombination of electrons and holes supplied from the first conductivity-type semiconductor layer 132 and the second conductivity-type semiconductor layer 136.

The active layer 134 may be formed of a semiconductor compound, for example, a Group III-V or II-VI compound semiconductor and have a single well structure, a multi-well structure, a quantum-wire structure, a quantum dot structure, or a quantum disk structure.

The active layer 134 may have a composition of $In_xAl_yGa_{1-x-y}N$ ($0 \leq x \leq 1$, $0 \leq y \leq 1$, and $0 \leq x+y \leq 1$) For example, when the active layer 134 has a quantum well structure, the active layer 134 may include a well layer (not shown) having a composition of $In_xAl_yGa_{1-x-y}N$ ($0 \leq x \leq 1$, $0 \leq y \leq 1$, and $0 \leq x+y \leq 1$) and a barrier layer (not shown) having a composition of $In_aAl_bGa_{1-a-b}N$ ($0 \leq a \leq 1$, $0 \leq b \leq 1$, and $0 \leq a+b \leq 1$). The energy bandgap of the well layer may be less than the energy bandgap of the barrier layer. The well layer and the barrier layer may be alternately stacked at least one time.

The second conductivity-type semiconductor layer 136 may be a semiconductor having a Group III-V or II-VI semiconductor compound, for example, $In_xAl_yGa_{1-x-y}N$ ($0 \leq x \leq 1$, $0 \leq y \leq 1$, and $0 \leq x+y \leq 1$) and may be doped with a p-type dopant (e.g., Mg, Zn, Ca, Sr, or Ba).

The semiconductor structure 130 may have the same shape as the substrate 110. For example, in order to raise the ratio of light extracted from the side surface of the substrate 110, the shape of the substrate 110 may be a pentahedron, for example, a triangular prism, but embodiments are not limited thereto. In other embodiments, the shape of the substrate 110 may be a hexahedron, for example, a rectangular prism.

For example, an internal angle between two adjacent sides of the semiconductor structure 130 may be an acute angle, for example, 45° or 60°.

Although the substrate 110 having the shape of a triangular prism, the nitride semiconductor layer 120 having the shape of a triangular prism, and the semiconductor structure 130 having the shape of a triangular prism are shown in FIG. 1, embodiments are not limited thereto. In other embodiments, each of the substrate, the nitride semiconductor layer, and the semiconductor structure may have the same shape as a polyhedron (e.g., a hexahedron) or a polygonal prism (e.g., a rectangular prism).

For electrical contact with a first electrode 142, the semiconductor structure 130 may include a region 204 for exposing the first conductivity-type semiconductor layer 132.

The first electrode 142 may be disposed on or connected to the exposed region 204 of the first conductivity-type semiconductor layer 132.

A second electrode 144 may be disposed on the second conductivity-type semiconductor layer 136 and is electrically connected to the second conductivity-type semiconductor layer 136. Each of the first electrode 142 and the second electrode 144 may include a conductive material, for example, at least one of aluminum (Al), titanium (Ti), chrome (Cr), nickel (Ni), copper (Cu), or gold (Au), and may be formed as a single layer structure or a multilayer structure.

Although not shown in FIGS. 1 and 2, the semiconductor device according to other embodiments may further include a passivation layer for covering the side surface of at least one of the semiconductor structure 130 or the substrate 110.

When using the semiconductor device including the substrate for a long time, efficiency of the semiconductor device is deteriorated. Efficiency deterioration includes J-droop caused by deterioration of current density and T-droop in which light emission efficiency decreases as the temperature of the semiconductor device increases.

When a forward current value is low, the external quantum efficiency of the semiconductor device may have a maximum value and current density may be deteriorated as the forward current value increases. As the temperature of the semiconductor device increases, the external quantum efficiency greatly decreases.

By inserting the pattern layer 115 having high thermal conductivity between the substrate 110 and the semiconductor structure 130, an embodiment can improve the heat dissipation effect of the semiconductor device 100 and relieve increase in the temperature of the semiconductor device 100. Thus, the degree of T-droop caused by increase in the temperature of the semiconductor device 100 is relieved and light emission efficiency, for example, external quantum efficiency, can be prevented from being deteriorated.

Figure 7:
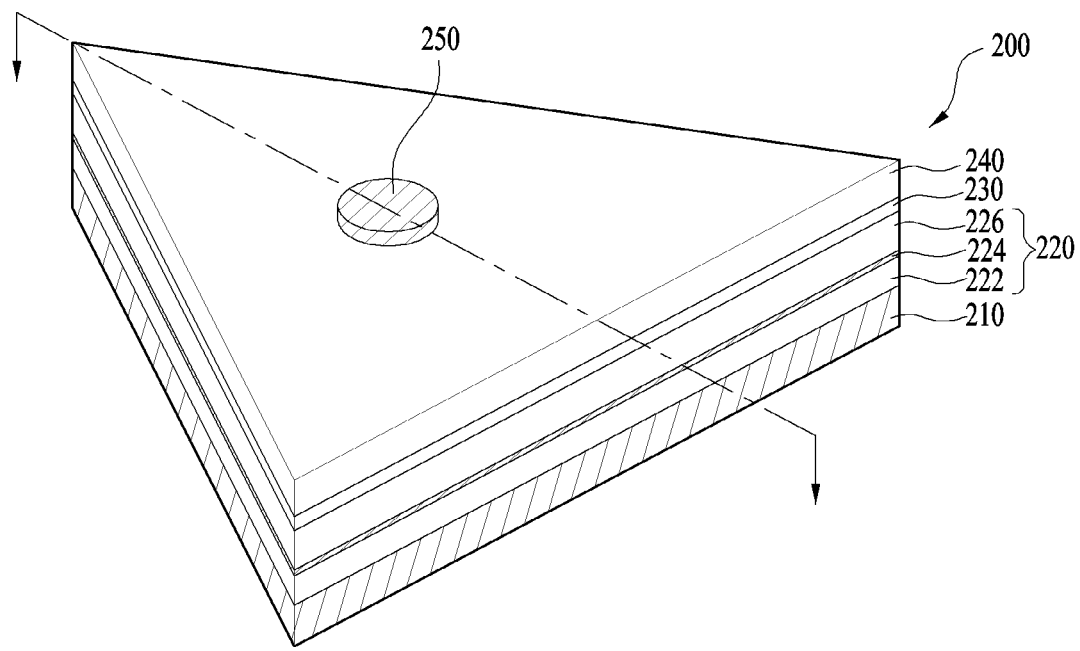
FIG. 7 is a perspective view of a semiconductor device according to another embodiment.
Figure 8:
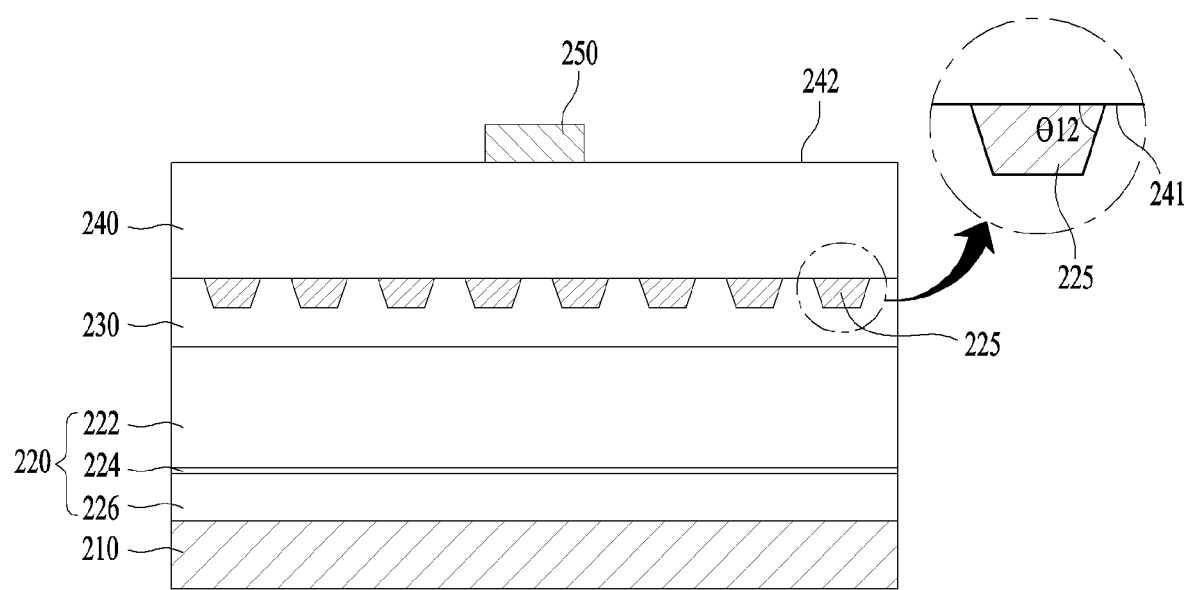
FIG. 8 is a sectional view of the semiconductor device taken along line A-B shown in FIG. 7.

FIG. 7 is a perspective view of a semiconductor device 200 according to another embodiment. FIG. 8 is a sectional view of the semiconductor device 200 taken along line A-B shown in FIG. 7.

Referring to FIGS. 7 and 8, the semiconductor device 200 includes a substrate 240, a first electrode 250 disposed on the substrate 240, a nitride semiconductor layer 230 disposed under the substrate 240, a pattern layer 225 disposed inside the nitride semiconductor layer 230, a semiconductor structure 220 disposed under the nitride semiconductor layer 230, and a second electrode 210 disposed under the semiconductor structure.

FIG. 8 will be described according to an order of layers disposed from the top to the bottom by referring to the surface of the substrate 240 disposed under the substrate 240 as an upper surface of the substrate 240 and referring to the surface of the substrate 240 disposed on the substrate 240 as a lower surface of the substrate 240.

The substrate 240 may be identical to the substrate 110 of FIGS. 1 and 2 and a description given with respect to the substrate 110 may be equally applied to the substrate 240.

The pattern layer 225 may be disposed on one surface of the substrate 240, for example, an upper surface 241 of the substrate 240. The pattern layer 225 may be identical to the pattern layer 115 of FIGS. 1 and 2 and a description given with respect to the pattern layers 115 and 115a to 115d may be equally applied to the pattern layer 225.

The nitride semiconductor layer 230 is disposed at the upper surface 241 of the substrate 240 on which the pattern layer 225 is formed. The nitride semiconductor layer 230 may be identical to the nitride semiconductor layer 120 of FIGS. 1 and 2 and a description given with reference to the nitride semiconductor layer 120 may be equally applied to the nitride semiconductor layer 230.

The semiconductor structure 220 is disposed on the nitride semiconductor layer 230.

When the nitride semiconductor layer 230 is formed of the same material as the substrate 240, for example, GaN or AlGaN, both the substrate 240 and the nitride semiconductor layer 230 may be defined as the nitride semiconductor layer. The pattern layer 225 may be disposed inside the nitride semiconductor layer 230 and includes a plurality of patterns which are separately disposed in parallel in a horizontal direction.

The semiconductor structure 220 may be disposed on the nitride semiconductor layer 230. The semiconductor structure 220 may include a first conductivity-type semiconductor layer 222, an active layer 224, and a second conductivity-type semiconductor layer 226.

The semiconductor structure 220 may be identical to the semiconductor structure 130 of FIGS. 1 and 2 and a description given with respect to the semiconductor structure 130 may be equally applied to the semiconductor structure 220 except for one region of the first conductivity-type semiconductor layer 130 exposed for arrangement of the first electrode.

The first electrode 250 is disposed on the other surface of the substrate 240 (e.g., a lower surface 242 which is the opposite surface of the upper surface 241).

A second electrode 210 is disposed on the second conductivity-type semiconductor layer 226 of the semiconductor structure 220.

Although, in FIG. 1, both the first electrode and the second electrode are disposed on the semiconductor structure 130 based on the semiconductor structure 130, the first electrode 250 may be disposed on the semiconductor structure 220 and the second electrode 210 may be disposed under the semiconductor structure 220, based on the semiconductor structure 220, as shown in FIG. 8.

The second electrode 210 may include a reflective layer formed of a metal or alloy including, for example, at least one of Ag, Ni, Al, Rh, Pd, Ir, Ru, Mg, Zn, Pt, Au, or Hf. According to another embodiment, the reflective layer may be formed as a single layer or multiple layers using a metal or alloy, and a light-transmissive conductive material such as IZO, IZTO, IAZO, IGZO, IGTO, AZO, or ATO. For example, the reflective layer may be formed of IZO/Ni, AZO/Ag, IZO/Ag/Ni, or AZO/Ag/Ni.

The second electrode 210 may further include an ohmic layer disposed between the reflective layer and the second conductivity-type semiconductor layer 226. The ohmic layer may include a metallic material in ohmic contact with the second conductivity-type semiconductor layer 226, for example, at least one of In, Zn, Sn, Ni, Pt, or Ag. The ohmic layer may also be formed by selectively using a light-transmissive conductive layer and a metal. For example, the ohmic layer may include one or more of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au, and Ni/$IrO_x$/Au/ITO and may be formed as a single layer or multiple layers.

The second electrode 210 may further include a support substrate disposed under the reflective layer.

In addition, the second electrode 210 may further include a barrier layer disposed between the support substrate and the reflective layer. The second electrode 210 may further include a bonding layer disposed between the barrier layer and the support substrate.

Although not shown in FIG. 8, the semiconductor device 200 may further include a passivation layer for covering side surfaces of the semiconductor structure 220, nitride semiconductor layer 230, and the substrate 240.

The semiconductor device 200 of the embodiment can improve the heat dissipation effect and relieve increase in temperature by inserting the pattern layer 225 having high thermal conductivity between the substrate 240 and the semiconductor structure 220. Then, T-droop caused by increase in temperature of the semiconductor device 200 is relieved and, thus, light emission efficiency, for example, external quantum efficiency, can be prevented from being deteriorated.

Figure 10B:
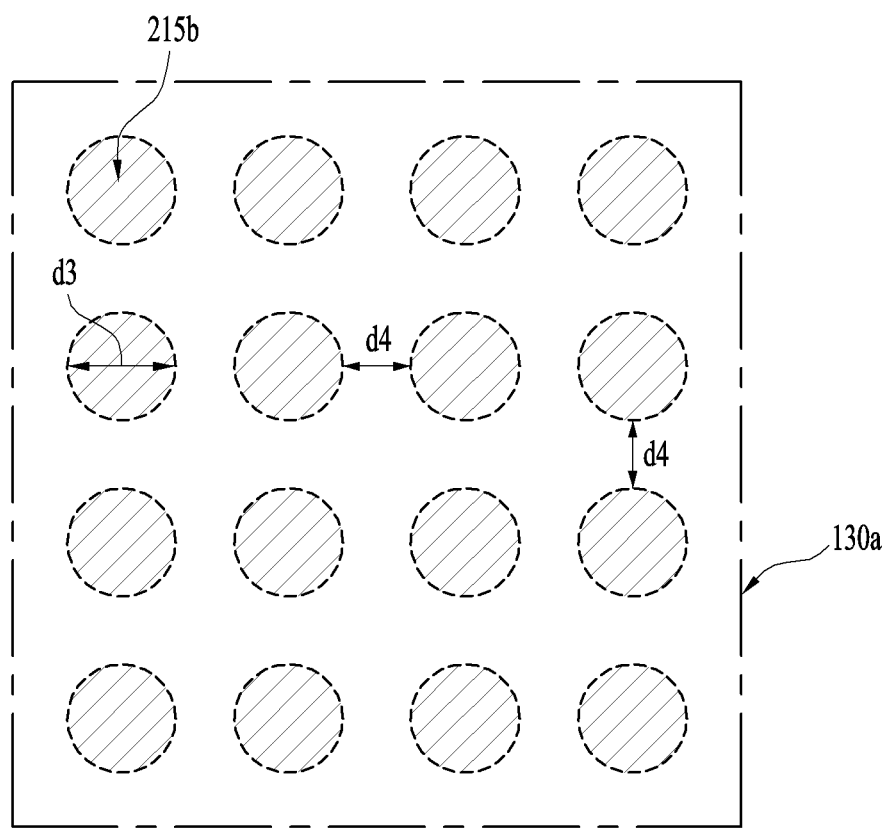
Figure 10C:
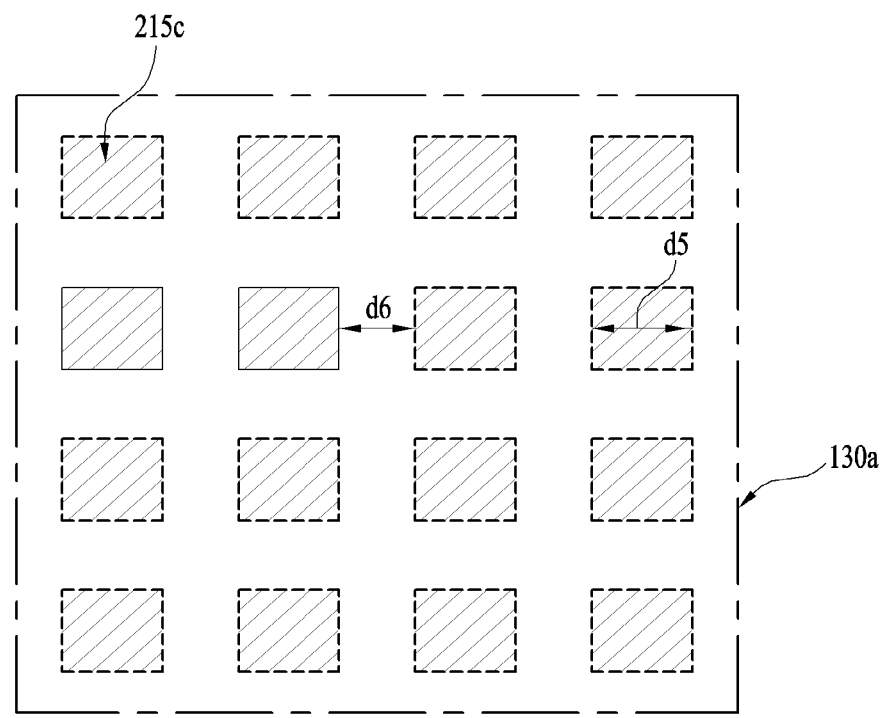
Figure 10D:
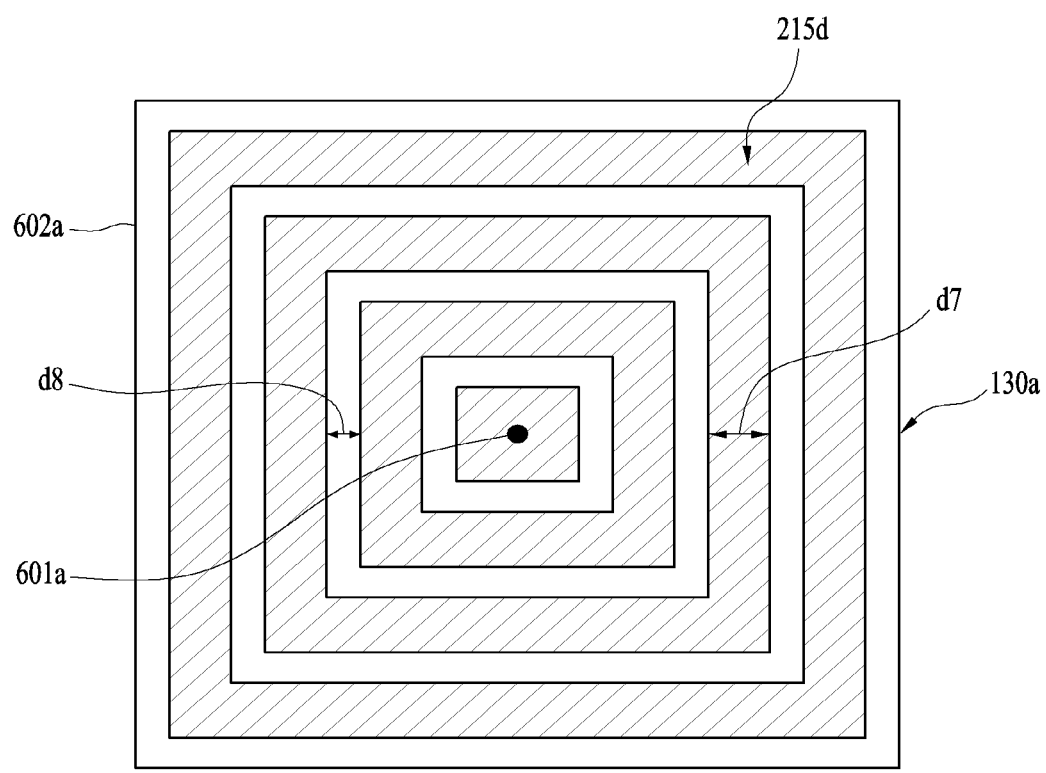

FIG. 10A illustrates a modified example of the embodiment of FIG. 3. FIG. 10B illustrates a modified example of the embodiment of FIG. 4. FIG. 10C illustrates a modified example of the embodiment of FIG. 5. FIG. 10D illustrates a modified example of the embodiment of FIG. 6.

Each of the substrate 110, the nitride semiconductor layer 120, and the semiconductor structure 130 of the embodiment of FIG. 1 has a triangular prismatic shape, whereas each of a substrate, a nitride semiconductor layer, and a semiconductor structure 130a of the embodiments of FIGS. 10A to 10D may have a rectangular prismatic or hexahedral shape.

A description of the widths or diameters d1, d3, d5, and d7 of the pattern layers 115a to 115d and the distances d2, d4, d6, and d8 between the pattern layers given with respect to FIGS. 3 to 6 may be applied to widths or diameters of pattern layers 215a, 215b, 215c, and 215d and distances between the pattern layers.

The shapes of the substrate, the nitride semiconductor layer, and the semiconductor structure of the embodiments are not limited to the above-described shapes. In other embodiments, each of the substrate, the nitride semiconductor layer, and the semiconductor structure may have the same shape as a polyhedron (e.g., hexahedron) or a polygonal prism (e.g., rectangular prism).

Figure 11:
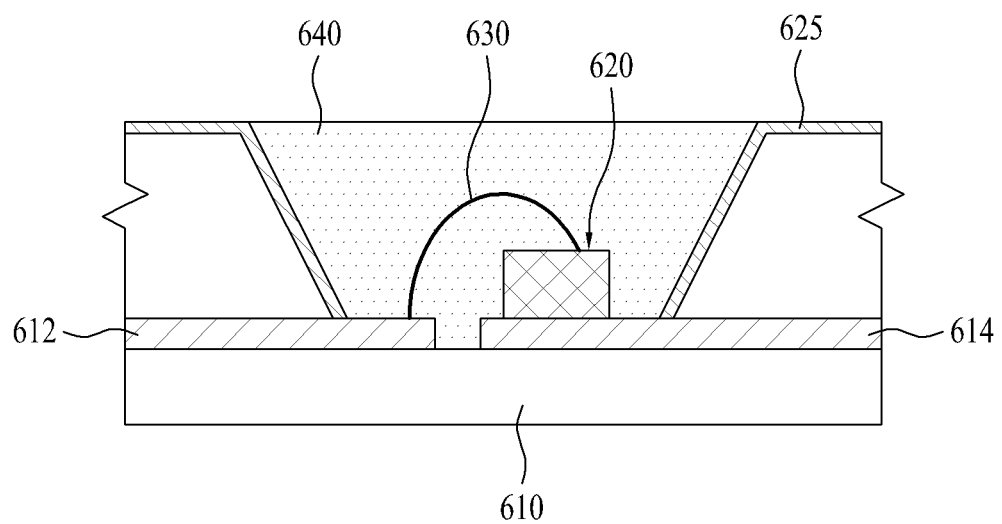
FIG. 11 is a sectional view of a semiconductor device package according to an embodiment.

FIG. 11 is a sectional view of a semiconductor device package according to an embodiment.

Referring to FIG. 11, a semiconductor device package 600 includes a package body 610, first and second lead frames 612 and 614, a semiconductor device 620, a reflective plate 625, a wire 630, and a resin layer 640.

A cavity may be formed on the package body 610. A side wall of the cavity may be inclined. Although the cavity is formed in the package body 610 in the embodiment of FIG. 11, embodiments are not limited thereto. According to other embodiments, the cavity may be omitted.

The package body 610 may be formed as a substrate having high insulating property or high terminal conductivity, such as a silicon-based wafer level package, a silicon substrate, a silicon carbide (SiC) substrate, or an aluminum nitride (AlN) substrate. The package body 610 may have a structure in which plural substrates are stacked.

Alternatively, the package body 610 may be formed of a resin material, for example, polyphthalamide (PPA) or an epoxy molding compound (EMC) resin. Embodiments are not limited to the above-described material, structure, and shape of the package body.

The first and second lead frames 612 and 614 are disposed on the package body so as to be electrically isolated from each other in consideration of heat dissipation or mounting of the semiconductor device. Each of the first and second lead frames 612 and 614 may be formed of a conductive layer.

The semiconductor device 620 is electrically connected to the first and second lead frames 612 and 614. The semiconductor device 620 may be any one of the embodiments 100 and 200. Although the embodiment 200 of FIGS. 7 and 8 is shown in FIG. 6, the embodiment 100 of FIGS. 1 and 2 may be bonded to the lead frames 612 and 614 by flip chip bonding according to other embodiments.

The reflective plate 625 is disposed on the sidewalls of the cavity of the package body 610 so as to guide light emitted from the semiconductor device 620 in a predetermined direction. The reflective plate 625 may be formed of a light reflecting material, for example, a metal coated material or a metal flake. According to other embodiments, the reflective plate 625 may be omitted.

The resin layer 640 surrounds the semiconductor device 620 located within the cavity of the package body 610 to protect the semiconductor device 620 from an external environment. The resin layer 640 may be formed of a colorless, transparent polymer resin material such as epoxy or silicone. The resin layer 640 may include a fluorescent substance so as to change the wavelength of light emitted from the semiconductor device 620.

Figure 12:
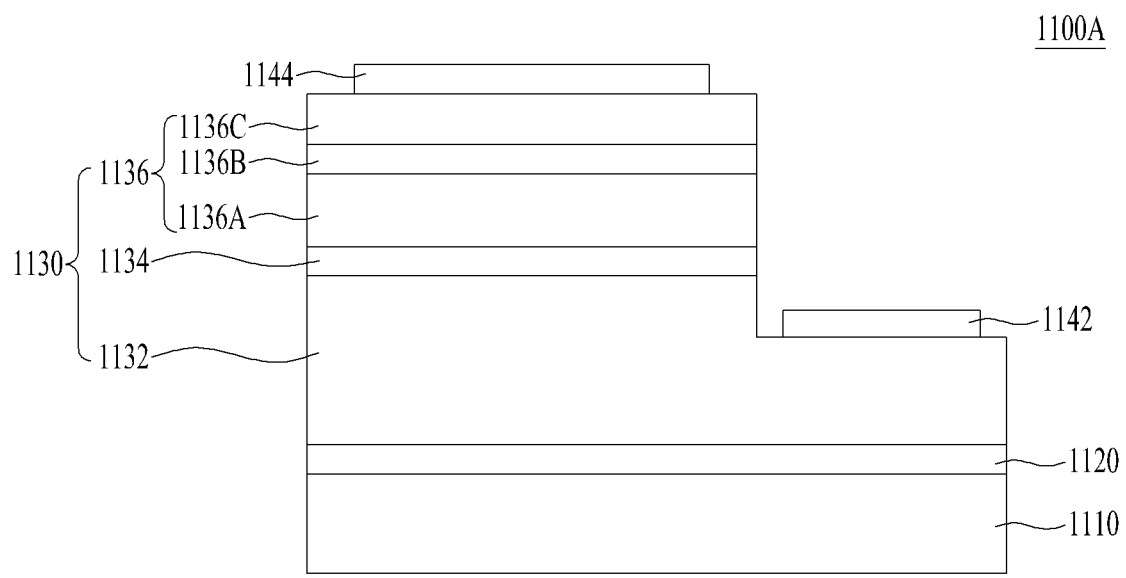
FIG. 12 illustrates a semiconductor device according to another embodiment.

FIG. 12 illustrates a semiconductor device 1100A according to another embodiment.

Referring to FIG. 12, the semiconductor device 1100A includes a substrate 1110, a buffer layer 1120, a semiconductor structure 1130, and first and second electrodes 1142 and 1144.

The substrate 1110 may include a conductive material or a non-conductive material. For example, the substrate 1110 may include at least one of sapphire ($Al_2O_3$), GaN, SiC, ZnO, GaP, InP, Ga2O3, GaAs, or Si.

In addition, a first layer 1132, which is a first conductivity-type semiconductor layer, may be used as the substrate without using a heterogeneous substrate such as sapphire.

For example, the substrate 1110 may include GaN or AlGaN, more specifically, $Al_xGa_{1-x}N$, wherein x may satisfy a value of the range equal to or greater than 0 and equal to or less than 0.5.

To improve the difference in the coefficient of thermal expansion and lattice mismatch between the substrate 1110 and the semiconductor structure 1130, a buffer layer (or a transition layer) 1120 may be disposed between the substrate 1110 and the semiconductor substructure 1130. The buffer layer 1120 may include at least one material selected from the group consisting of, for example, Al, In, N, and Ga but embodiments are not limited thereto. The buffer layer 1120 may have the structure of a single layer or multiple layers.

The semiconductor structure 1130 may include a first conductivity-type semiconductor layer 1132, an active layer 1134, and a second conductivity-type semiconductor layer 1136, which are sequentially disposed on the buffer layer 1120.

The first conductivity-type semiconductor layer 1132 is disposed on the buffer layer 1120 and may be formed of a Group III-V or II-VI compound semiconductor doped with a first conductivity-type dopant.

If the first conductivity-type semiconductor layer 1132 is an n-type semiconductor layer, the first conductivity-type dopant may include Si, Ge, Sn, Se, or Te as an n-type dopant but embodiments are not limited thereto.

For example, the first conductivity-type semiconductor layer 1132 may include a semiconductor material having a composition of $Al_xIn_yG_{(1-x-y)}N(0 \leq x \leq 1, 0 \leq y \leq 1$, and $0 \leq x+y \leq 1)$. The first conductivity-type semiconductor layer 132 may include at least one of GaN, InN, AlN, InGaN, AlGaN, InAlGaN, AlInN, AlGaAs, InGaAs, AlInGaAs, GaP, AlGaP, InGaP, AlInGaP, or InP.

The active layer 1134 is disposed on the first conductivity-type semiconductor layer 1132. The active layer 1134 emits light having energy determined by an energy bandgap specific to materials constituting the active layer 1134 through recombination of electrons (or holes) injected through the first conductivity-type semiconductor layer 1132 and holes (or electrons) injected through the second conductivity-type semiconductor layer 1136. The active layer 134 may be formed with at least one of a single well structure, a multi-well structure, a single quantum well structure, a multi quantum well (MQW) structure, a quantum-wire structure, or a quantum dot structure.

A well layer/barrier layer of the active layer 1134 may be formed with at least one pair structure of InGaN/GaN, InGaN/InGaN, GaN/AlGaN, InAlGaN/GaN, GaAs (InGaAs)/AlGaAs, or GaP (InGaP)/AlGaP but embodiments are not limited thereto. The well layer may be formed of a material having a lower energy bandgap than the barrier layer.

A conductive clad layer (not shown) may be formed on and/or under the active layer 1134. The conductive clad layer may be formed of a semiconductor having higher energy bandgap than the barrier layer of the active layer 1134. For example, the conductive clad layer may include GaN, AlGaN, InAlGaN, or a super lattice structure. The conductive clad layer may be doped with an n-type or p-type dopant.

According to the embodiment, the active layer 1134 may emit ultraviolet wavelength light. Herein, ultraviolet wavelength light may be light having a wavelength of 100 nm to 400 nm. Particularly, the active layer 1134 may emit light having a wavelength of 100 nm to 280 nm.

The second conductivity-type semiconductor layer 1136 is disposed on the active layer 1134 and may be formed of a compound semiconductor, for example, a Group III-V or II-VI compound semiconductor. As an example, the second conductivity-type semiconductor layer 1136 may include a semiconductor material having a composition of $In_xAl_yGa_{1-x-y}N$ $(0 \leq x \leq 1, 0 \leq y \leq 1$, and $0 \leq x+y \leq 1)$.

The second conductivity-type semiconductor layer 1136 may be doped with a second conductivity-type dopant. If the second conductivity-type semiconductor layer 1136 is a p-type semiconductor layer, the second conductivity-type dopant may include Mg, Zn, Ca, Sr, or Ba as a p-type dopant.

The first conductivity-type semiconductor layer 1132 may be implemented as an n-type semiconductor layer and the second conductivity-type semiconductor layer 1136 may be implemented as a p-type semiconductor layer. Alternatively, the first conductivity-type semiconductor layer 1132 may be implemented as the p-type semiconductor layer and the second conductivity-type semiconductor layer 1136 may be implemented as the n-type semiconductor layer.

The semiconductor structure 1130 may be implemented as one of an N-P junction structure, a P-N junction structure, an N-P-N junction structure, and a P-N-P junction structure.

According to the embodiment, when the active layer 1134 emits ultraviolet wavelength light as described above, the second conductivity-type semiconductor layer 1136 may include a second conductivity-type first semiconductor layer 1136A and a second conductivity-type second semiconductor layer 1136C.

The second conductivity-type first semiconductor layer 1136A is disposed on the active layer 1134. Each of the second conductivity-type first semiconductor layer 1136A and the first conductivity-type semiconductor layer 1132 may include AlGaN because AlGaN absorbs less ultraviolet wavelength light than GaN or InAlGaN.

The second conductivity-type second semiconductor layer 1136C is disposed on the second conductivity-type first semiconductor layer 1136A. The second conductivity-type second semiconductor layer 1136C serves to improve electrical characteristics of the ultraviolet semiconductor device 1100A by smoothly supplying holes from the second electrode 1144 to the active layer 1134. For example, the second conductivity-type second semiconductor layer 1136C may include GaN or InAlGaN.

If the first conductivity-type is n-type and the second conductivity-type is p-type, the second conductivity-type first semiconductor layer 1136A may serve as an electron blocking layer (EBL). Alternatively, the second conductivity-type first semiconductor layer 1136A serving as the EBL may have the structure of an AlGaN/AlGaN super lattice layer or the structure of an AlGaN bulk layer.

The energy bandgap of the second conductivity-type first semiconductor layer 1136A may be greater than the energy bandgap of the active layer 1134 so that light emitted from the active layer 1134 may be transmitted to the second conductivity-type first semiconductor layer 1136A without being absorbed in the second conductivity-type first semiconductor layer 1136A. To this end, although varying with the wavelength of light emitted from the active layer 1134, the content ratio of aluminum contained in the second conductivity-type first semiconductor layer 1136A may be 0.3 or more.

The second conductivity-type semiconductor layer 1136 may further include a second conductivity-type third semiconductor layer 1136B.

The second conductivity-type third semiconductor layer 1136B is disposed between the second conductivity-type first semiconductor layer 1136A and the second conductivity-type second semiconductor layer 1136C. For example, the second conductivity-type third semiconductor layer 1136B may include at least one AlGaN layer.

For example, when the second conductivity-type third semiconductor layer 1136B includes a plurality of AlGaN layers, density of the AlGaN layers may differ. For example, the density of aluminum of the ALGaN layers of the second conductivity-type third semiconductor layer 1136B may gradually increase or decrease in the direction of the second conductivity-type second semiconductor layer 1136C from the second conductivity-type first semiconductor layer 1136A.

The first electrode 1142 is disposed on the first conductivity-type semiconductor layer 1132 exposed by mesa etching. The first electrode 1412 may include a material for serving to perform ohmic contact and, thus, an additional ohmic layer (not shown) need not be disposed. Alternatively, the additional ohmic layer may be disposed under the first electrode 1142.

The second electrode 144 may be disposed on the second conductivity-type second semiconductor layer 1136C. Each of the first and second electrodes 1142 and 1144 may reflect or transmit light without absorbing light emitted from the active layer 1134 or may be formed of a high quality material capable of being grown on the first and second conductivity-type semiconductor layers 1132 and 1136.

For example, each of the first and second electrodes 1142 and 1144 may be formed of a metal consisting of Ag, Ni, Al, Rh, Pd, Ir, Ru, Mg, Zn, Pt, Au, or Hf and a selective combination thereof.

Particularly, the second electrode 1144 may be a transparent conductive oxide (TCO) layer. For example, the second electrode 1144 may include the above-described metallic material and at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO. However, embodiments are not limited thereto. The second electrode 1144 may include a material ohmic-contacting the second conductivity-type second semiconductor layer 1136C.

The second electrode 1144 may be formed of a reflective electrode material having an ohmic contact characteristic as a single-layer structure or a multi-layer structure. If the second electrode 144 serves as an ohmic electrode, an additional ohmic layer (not shown) may not be formed.

Figure 13:
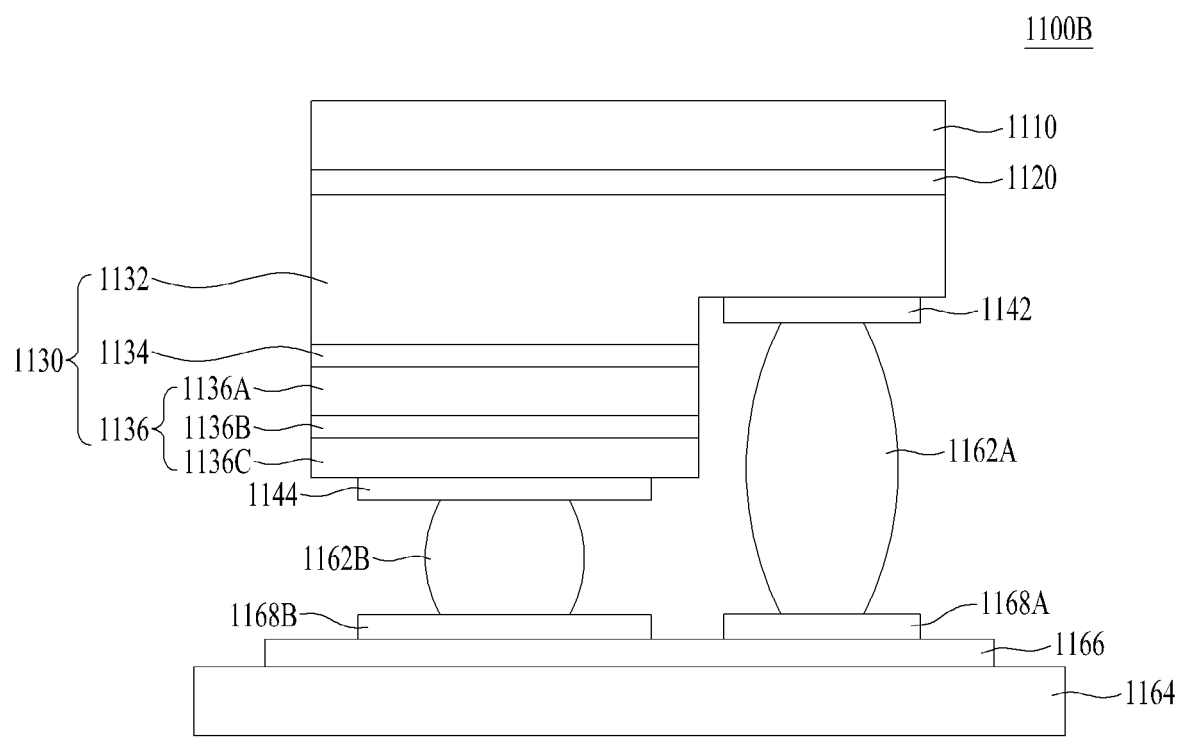
FIG. 13 illustrates a semiconductor device according to still another embodiment.

FIG. 13 illustrates a semiconductor device according to still another embodiment.

Since the ultraviolet semiconductor device 1100A shown in FIG. 12 has a horizontal structure, light emitted from the active layer 1134 is emitted through the second conductivity-type semiconductor layer 1136 and the second electrode 1144. To this end, the second conductivity-type semiconductor layer 1136 and the second electrode 1144 may be formed of light transmissive materials and the first conductivity-type semiconductor layer 1132, the buffer layer 1120, and the substrate 1110 may be formed of light transmissive materials or non-light-transmissive materials.

However, since a semiconductor device 1100B shown in FIG. 13 is a flip chip bonding structure, light emitted from the active layer 1134 is emitted through the substrate 1110, the buffer layer 1120, and the first conductivity-type semiconductor layer 1132. To this end, the substrate 1110, the buffer layer 1120, and the first conductivity-type semiconductor layer 1132 may be formed of light transmissive materials and the second conductivity-type semiconductor layer 1136 and the second electrode 1144 may be formed of light transmissive materials or non-light-transmissive materials.

Unlike the semiconductor device 1100A shown in FIG. 12, the semiconductor device 1100B shown in FIG. 13 has a flip chip bonding structure. Therefore, the semiconductor device 1100B may further include first and second bumps 1162A and 1162B, a submount 1164, a protective layer 1166, and first and second metal layers (or electrode pads) 1168A and 1168B.

Except for these differences, the semiconductor device 1100B shown in FIG. 13 is identical to the semiconductor device 1100A shown in FIG. 12. Accordingly, the same reference numerals will be used for repeated parts and a detailed description of repeated parts will be omitted.

The submount 1164 may be a semiconductor substrate of, for example, AlN, BN, SiC, GaN, GaAs, or Si. However, embodiments are not limited thereto and may be formed of a semiconductor material having high thermal conductivity. An element of a Zener diode type for preventing electrostatic discharge (ESD) may be included in the submount 1164.

The first and second metal layers 1168A and 1168B are separately disposed on the submount 1164 in a horizontal direction. The first bump 1162A is disposed between the first metal layer 1168A and the first electrode 1142 and the second bump 1162B is disposed between the second metal layer 1168B and the second electrode 1144.

The first electrode 1142 is connected to the first metal layer 1168A of the submount 1164 through the first bump 1162A. The second electrode 1144 is connected to the second metal layer 1168B of the submount 1164 through the second bump 1162B.

Although not shown in the drawing, a first upper bump metal layer (not shown) may be further disposed between the first electrode 1142 and the first bump 1162A and a first lower bump metal layer (not shown) may be further disposed between the first metal layer 1168A and the first bump 1162A.

In this case, the first upper bump metal layer and the first lower bump metal layer serve to indicate a place at which the first bump 1162A is to be located. Similarly, a second upper bump metal layer (not shown) may be further disposed between the second electrode 1144 and the second bump 1162B and a second lower bump metal layer (not shown) may be disposed between the second metal layer 1168B and the second bump 1162B. In this case, the second upper bump metal layer and the second lower bump metal layer serve to indicate a place at which the second bump 1162A is to be located.

If the submount 1164 is formed of a material having electrical conductivity such as silicon (Si), the embodiment 100B may further include a protective layer 1166 disposed between the first and second metal layers 1168A and 1168B and the submount 1164 as shown in FIG. 13. Herein, the protective layer 1166 may be formed of an insulating material.

In the active layer of an MQW structure, the thickness of a quantum well may be thicker than the thickness of a quantum wall. 10 to 20 pairs of quantum walls and quantum wells may be disposed. More specifically, the thickness of a quantum wall may be less than 40 angstroms and the thickness of a quantum well may be greater than 40 angstroms.

For example, the thickness of the quantum well may be 43 to 45 angstroms and the thickness of the quantum wall may be 34 to 37 angstroms. The last quantum wall may have a thickness of 98 angstroms because the last quantum wall may serve as an EBL which will be described later.

In a semiconductor structure grown on a conventional sapphire substrate, an active layer of an MQW structure could be formed such that the thickness of the quantum well is about 32 angstroms, the thickness of the quantum wall is about 54 angstroms, and the last quantum wall is formed to a thickness of 80 angstroms.

That is, in a nitride semiconductor layer grown on the conventional sapphire, when the thickness of the quantum well is excessively thick, the semiconductor layer could not be sufficiently grown because the quality of an MQW of an InGaN/GaN structure is deteriorated and crystallinity is weak. However, when the semiconductor layer is grown on a homogeneous substrate and a second layer is doped with a high-density of silicon, crystallinity is not deteriorated and the semiconductor layer can be sufficiently grown even though the thickness of the quantum well increases by 40 angstroms or more. In addition, since electrons and holes are sufficiently combined in a quantum well having thicker thickness than a conventional quantum well, luminous efficiency of the semiconductor device can be improved.

The quantum well may be formed of a material having energy bandgap lower than the quantum wall.

Figure 14:
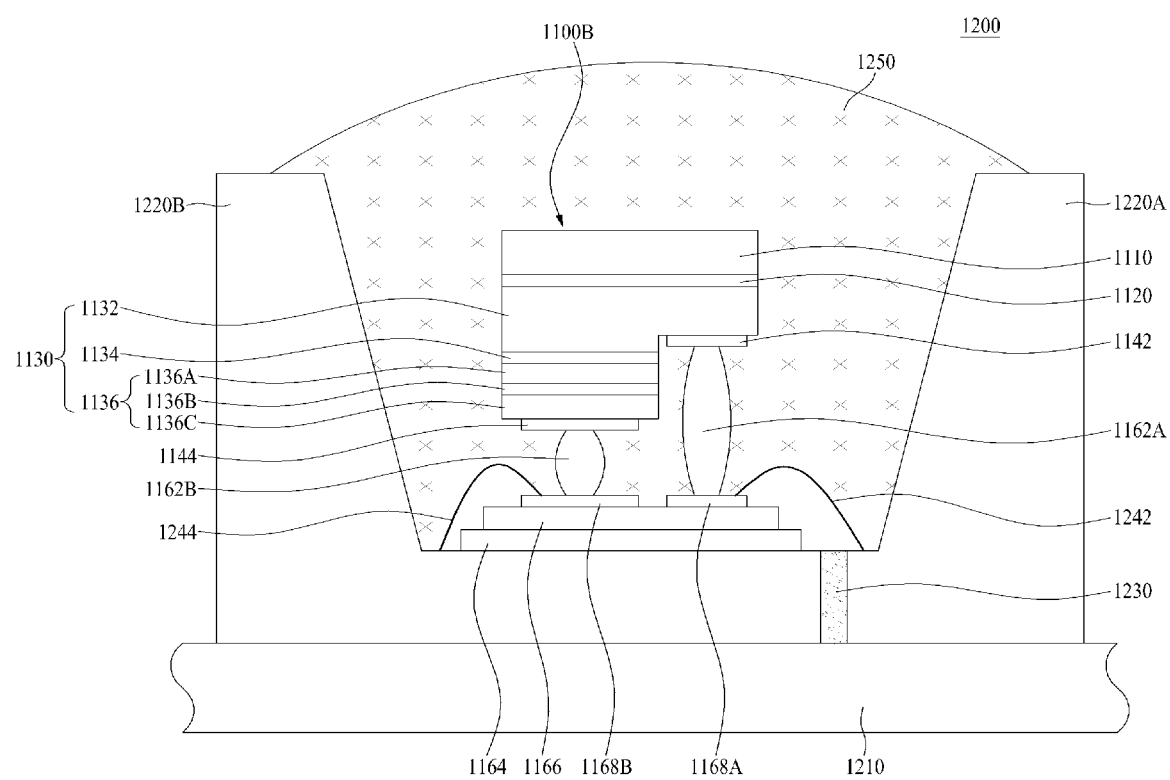
FIG. 14 illustrates a semiconductor device package according to another embodiment.

FIG. 14 illustrates a semiconductor device package 1200 according to another embodiment.

The semiconductor device package 1200 according to the embodiment includes a semiconductor device 1100B, a substrate layer 1210, first and second package bodies 1220A and 1220B, an insulating material 1230, first and second wires 1242 and 1244, and a molding member 1250. The semiconductor device 1100B corresponds to the semiconductor device shown in FIG. 13. Accordingly, the same reference numerals will be used for repeated parts and a detailed description of repeated parts will be omitted. In addition to the semiconductor device 1100B shown in FIG. 13, the semiconductor device 1100A shown in FIG. 12 may also be included in the semiconductor device package shown in FIG. 14.

The first and second package bodies 1220A and 1220B are disposed on the substrate layer 1210. Herein, the substrate layer 1210 may be a printed circuit board (PCB) but embodiments are not limited thereto. When the semiconductor device 1100B emits ultraviolet light, the first and second package bodies 1220A and 1220B may be implemented as aluminum materials in order to improve a heat dissipation characteristic but embodiments are not limited thereto.

Although the submount 1164 is illustrated as being disposed on the second package body 1220B in FIG. 14, embodiments are not limited thereto. That is, the submount 1164 may be disposed on the first package body 1220A rather than the second package body 1220B. The first and second metal layers 1168A and 1168B of the semiconductor device 1100B are connected to the first and second package bodies 1220A and 1220B by the first and second wires 1242 and 1244, respectively. When first and second package bodies 1220A and 1220B are implemented as aluminum materials having electrical conductivity, the insulating material 1230 serves to electrically isolate the first package body 1220A from the second package body 1220B.

The first conductivity-type semiconductor layer 1132 may be electrically connected to the substrate layer 1210 through the first electrode 1142, the first bump 1162A, the first metal layer 1168A, the first wire 1242, and the first package body 1220A. The second conductivity-type semiconductor layer 1136 may be electrically connected to the substrate layer 1210 through the second electrode 1144, the second bump 1162B, the second metal layer 1168B, the second wire 1244, and the second package body 1220B.

The molding member 1250 fills a cavity formed by the first and second package bodies 1220A and 1220B to surround the semiconductor device 1100B and protect the semiconductor device 1100B. The molding member 1250 may include a fluorescent substance and change the wavelength of light emitted from the semiconductor device 1100B.

Figure 19:
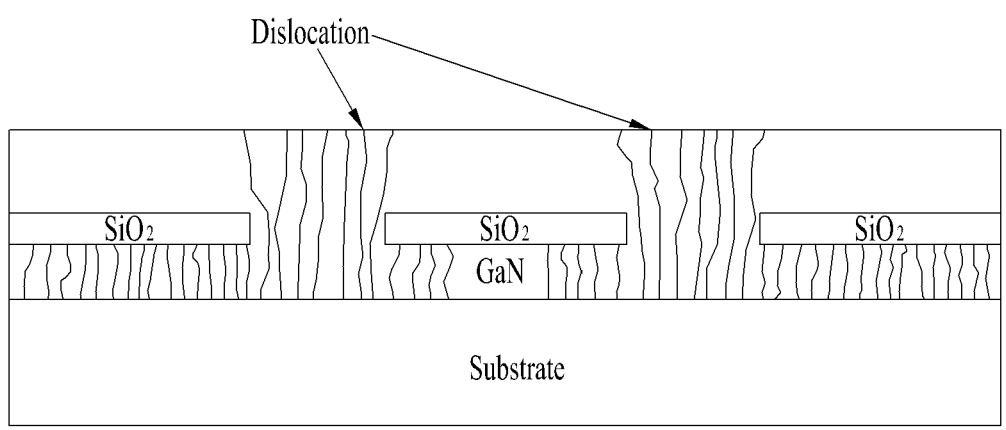
FIG. 19 is a view illustrating growth of a nitride semiconductor using an ELOG scheme.

FIG. 19 is a view illustrating growth of a nitride semiconductor using an epitaxial lateral overgrowth (ELOG) scheme.

Referring to FIG. 19, masks may be formed using silicon oxide ($SiO_2$) at a middle part of a nitride semiconductor (GaN) grown on a substrate so that the nitride semiconductor grown in a region between the masks 1801 may be grown in a vertical direction as well as a horizontal direction on the masks. In this case, defects are blocked by the masks 1801. As a result, defects may be removed or reduced in a region on the masks 1801.

Figure 20:
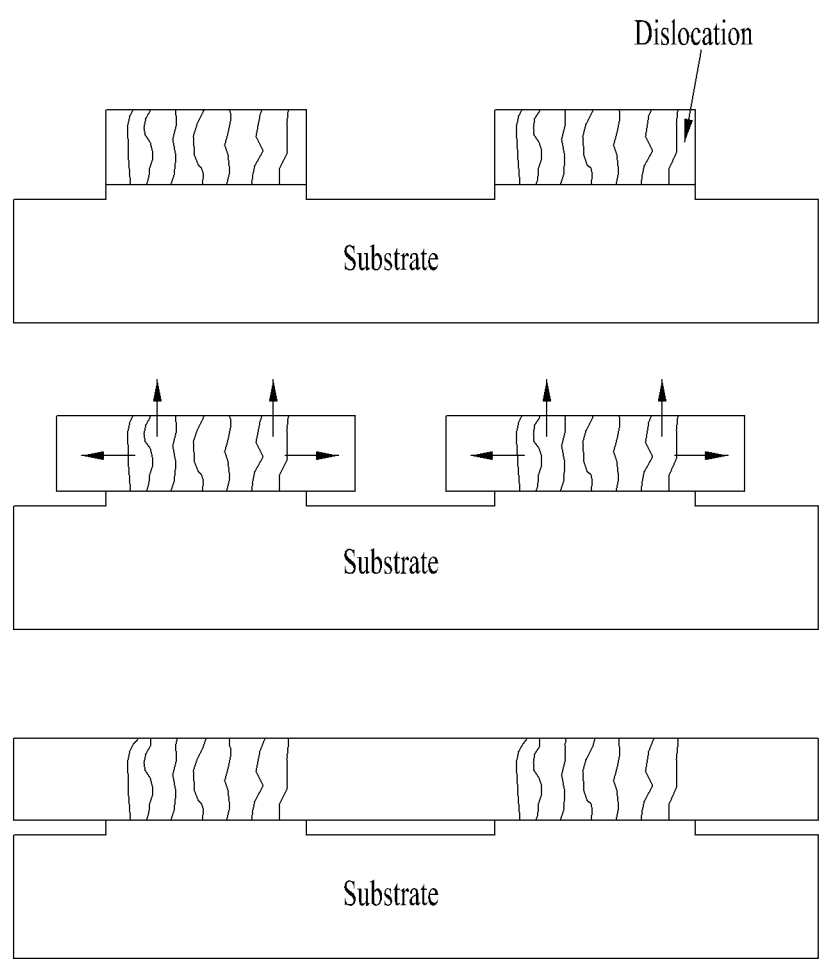
FIG. 20 is a view illustrating growth of a nitride semiconductor using a pendeo growth scheme

FIG. 20 is a view illustrating growth of a nitride semiconductor using a pendeo growth scheme. Referring to FIG. 20, a groove is formed by etching a substrate and a nitride semiconductor layer is grown in a first region in which the groove is not formed. In this case, the nitride semiconductor grown in the first region of the substrate is vertically and horizontally grown so that the nitride semiconductor layer is formed throughout the upper surface of the substrate. However, such growth of the nitride semiconductor has the following problems.

In the ELOG scheme, a tile occurs due to friction between a silicon oxide material used as the masks 1801 and GaN and dislocation occurs so that the quality of the nitride semiconductor layer may be deteriorated. Further, since the nitride semiconductor is grown in the upper region of the mask through horizontal growth, a growth time may increase.

The pendeo growth scheme requires etching of a sapphire substrate. Thus, a process time increases and it is difficult to accurately form patterns on the sapphire substrate.

As described above, quality deterioration of a nitride semiconductor layer constituting a semiconductor device cannot be solved even by the ELOG scheme or the pendeo growth scheme.

Although the quality problem of the nitride semiconductor layer is solved, the horizontal semiconductor device shown in FIG. 12 and the flip chip semiconductor device shown in FIG. 13 may degrade luminous efficiency because the amount of light extracted from the side surface of the semiconductor device is greater than the amount of light extracted from the upper side of the semiconductor device.

In terms of light extraction of the semiconductor device, the vertical semiconductor device has a surface emitter structure, whereas the horizontal semiconductor device and the flip chip semiconductor device may have a volume emitter structure.

That is, the horizontal semiconductor device and the flip chip semiconductor device have a higher ratio of light extracted from the upper surface relative to light extracted from the lateral surface than the vertical type semiconductor device.

To improve light extraction of the horizontal semiconductor device and the flip chip semiconductor device having the volume emitter structure, it is important to increase the area of a side surface of a semiconductor device having the same volume.

Hereinafter, a structure for improving light extraction by increasing the area of the side surface of a semiconductor device will be described with reference to embodiments shown in FIGS. 15 and 16.

Figure 15:
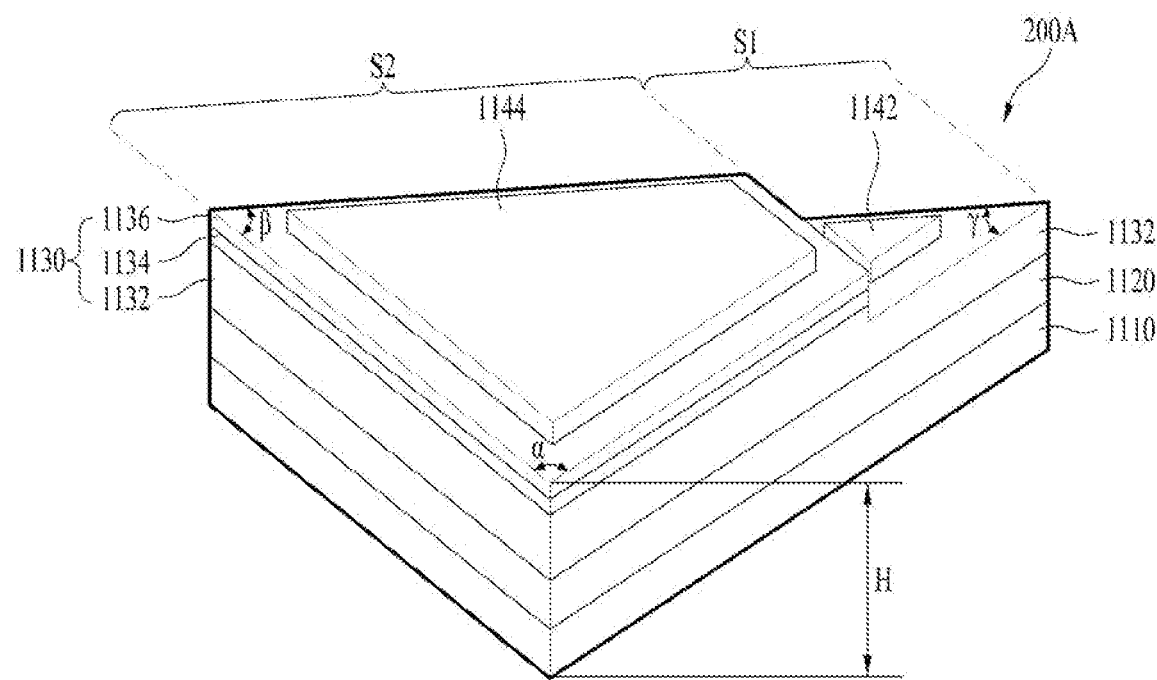
FIG. 15 is a perspective view of a semiconductor device according to still another embodiment.

FIG. 15 is a perspective view of a semiconductor device 200A according to still another embodiment. FIG. 16 illustrates an upper surface of the semiconductor device 200A of FIG. 15.

A description given with respect to the semiconductor devices shown in FIGS. 12 and 13 is equally applicable to the semiconductor device 200A shown in FIG. 15. Accordingly, only differences between the semiconductor devices shown in FIGS. 12 and 13 and the semiconductor device 200A will be described.

The semiconductor device 200A according to an embodiment may include a semiconductor structure 1130 including a first conductivity-type semiconductor layer 1132, an active layer 1134, and a second conductivity-type semiconductor layer 1136.

The compositions and functions of the first conductivity-type semiconductor layer 1132, the active layer 1134, and the second conductivity-type semiconductor layer 1136 described with reference to FIGS. 12 and 13 may be applied to the first conductivity-type semiconductor layer 1132, the active layer 1124, and the second conductivity-type semiconductor layer 1136.

A cross-section of the semiconductor device 200A according to an embodiment may be a triangle or a trapezoid.

The semiconductor device 200A of the embodiment may include a first region S1 and a second region S2.

The first region S1 may include a region in which a part of the first conductivity-type semiconductor layer 1132 is exposed. A first electrode 1142 may be disposed on the exposed region of the first conductivity-type semiconductor layer 1132 of the first region S1.

The second region S2 may include a region in which the second conductivity-type semiconductor layer 1136 is externally exposed. A second electrode 1144 may be disposed on the second conductivity-type semiconductor layer 1136.

The first region S1 and the second region S2 may be provided to have a preset height or a height difference.

For example, the preset height may be a height from the upper surface of the first region S1 to the upper surface of the second conductivity-type semiconductor layer 1136 of the second region S2 and may be a height sufficient to expose the active layer 1134 and a part of the first conductivity-type semiconductor layer 1132.

This is because the first electrode 1142 is disposed in the first region S1 so as to supply current to the first conductivity-type semiconductor layer 1132, when a part of the first conductivity-type semiconductor layer 1132 is exposed.

Although the preset height is shown in FIG. 15 as a height from the upper surface of the second region S2 to a part of the first conductivity-type semiconductor layer 1132, this is purely for convenience of description and a user may modify the preset height in various manners according to convenience.

The cross-section of the first conductivity-type semiconductor layer 1132 disposed on the first region S1 may have a triangular shape and the first electrode 1142 disposed on the first conductivity-type semiconductor layer 1132 may also have a triangular shape.

However, the first electrode 1142 shown in a triangular shape is only for exemplary description. The first electrode 1142 is not limited to a triangular shape and may have other shapes.

In addition, the cross-section of the second conductivity-type semiconductor layer 1136 disposed in the second region S2 may have a triangular or trapezoidal shape and the second electrode 1144 disposed on the second conductivity-type semiconductor layer 1136 may also have a triangular or trapezoidal shape.

However, the second electrode 1144 shown in a triangular or trapezoidal shape is only for exemplary description. The second electrode 1144 is not limited to a triangular or trapezoidal shape and may have other shapes.

The semiconductor device 200A of the embodiment may be provided with a preset height H from the bottom of the semiconductor device 200A (e.g., the lower surface of the substrate 110) to the top of the semiconductor device 200A (e.g., the upper surface of the second conductivity-type semiconductor layer 1136).

In terms of light extraction of a semiconductor device, the semiconductor device 200A of the embodiment may be defined as having a volume emitter structure.

For example, unlike a general vertical semiconductor device having a surface emitter structure, the semiconductor device 200A of the embodiment has a greater amount of light extracted from the side surface than light extracted from the upper surface. Herein, the surface emitter structure may be a structure in which the amount of light extracted from the upper surface of the semiconductor device is greater than the amount of light extracted from the side surface of the semiconductor device.

To increase light extraction efficiency in a direction of the side surface of the semiconductor device, it is necessary to maximize an area of the side surface of the semiconductor device. The area of the side surface of the semiconductor device may be the height of the semiconductor device times the perimeter length of the semiconductor device. Consequently, in order to improve light extraction efficiency at the side surface of the semiconductor device, it is important to maximize the height of the semiconductor device and the perimeter length of the upper surface of the semiconductor device.

Figure 17:
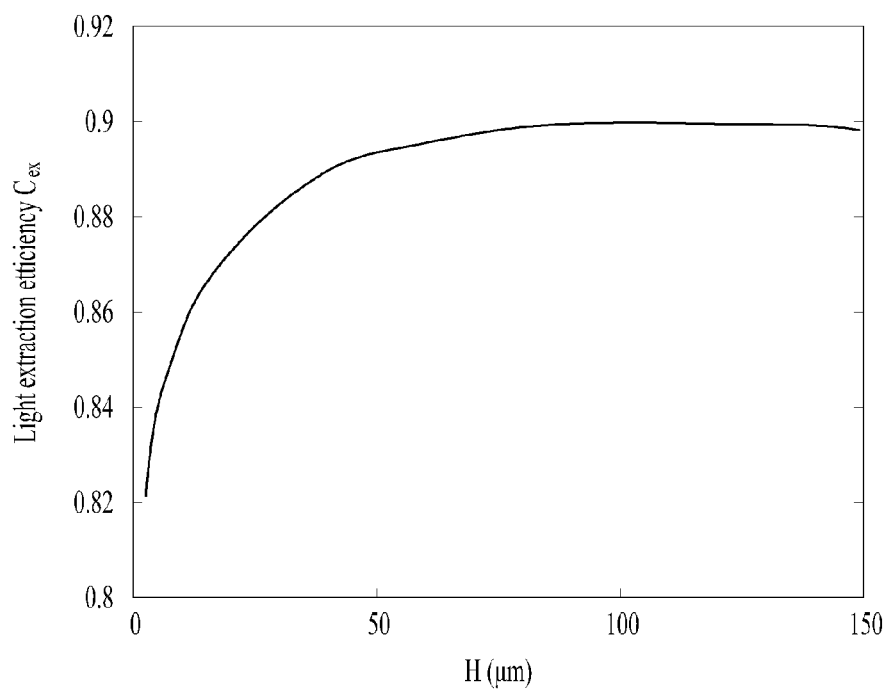
FIG. 17 illustrates light extraction efficiency in accordance with the height of a semiconductor device according to an embodiment.

FIG. 17 illustrates light extraction efficiency in accordance with the height of a semiconductor device according to an embodiment.

In FIG. 17, the x axis denotes the height of the semiconductor device 200A and the y axis denotes an experimental value of light extraction efficiency $C_{ex}$ according to the height of the semiconductor device 200A.

Referring to FIG. 17, as the height H of the semiconductor device 200A increases, the light extraction efficiency $C_{ex}$ tends to increase. In this case, the height of the semiconductor device 200A may be represented using the thickness of the semiconductor device 200A.

When 0 μm<H≤10 μm, the light extraction efficiency of the semiconductor device 200A is about 82% to 84%, which is a value corresponding to the light extraction efficiency of a general semiconductor device having the surface emitter structure.

When the height H of the semiconductor device 200A is 60 μm or more, the light extraction efficiency of the semiconductor device 200A may be about 90% which may correspond to the light extraction efficiency of the semiconductor device of the embodiment having the volume emitter structure.

That is, the fact that, as the height of the semiconductor device 200A increases, the light extraction efficiency of the semiconductor device 200A increases may be derived.

However, when the height of the semiconductor device 200A is about 90 μm or more, it can be seen that the light extraction efficiency is saturated.

This is because light is absorbed by an internal structure of the semiconductor device 200A including GaN or AlGaN even when the height H of the semiconductor device 200A is about 90 μm or more.

For example, height H of the semiconductor device 200A of the embodiment may be equal to or greater than 60 μm and equal to or less than 300 μm. However, this is purely for exemplary description and a user may modify the range of the height of the semiconductor device 200A of the embodiment in various manners.

As described above, the planar shape of the cross-section or upper surface of the semiconductor device 200A of the embodiment may be a triangle.

Figure 16:
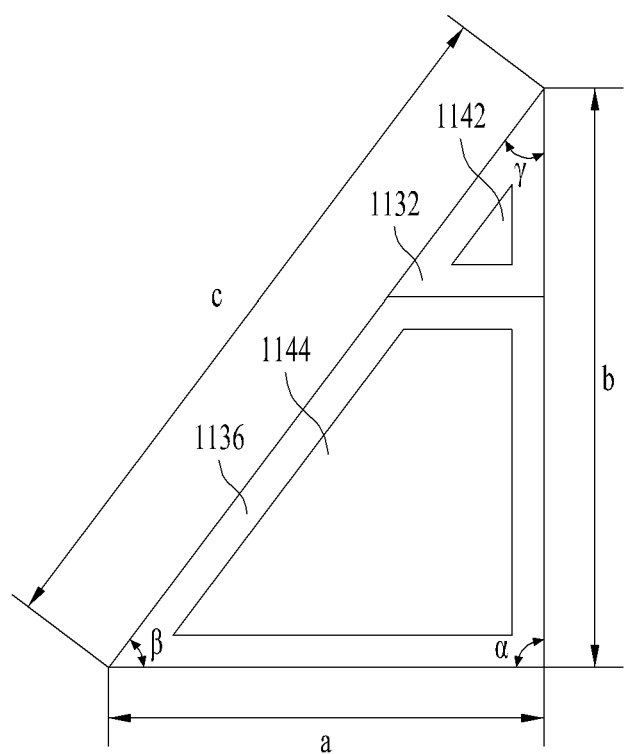
FIG. 16 illustrates an upper surface of the semiconductor device of FIG. 15.

Referring to FIG. 16, the shape of the cross-section or upper surface of the semiconductor device 200A, for example, the planar shape of the cross-section or upper surface of the semiconductor structure 1130, may be a triangle including three sides a, b, and c.

For example, the three sides may include the first side a and the second and third sides b and c which are adjacent to the first side a.

Among the first to third sides, two adjacent sides intersect and an angle formed by two adjacent sides may be an acute angle.

An internal angle formed by the first side a and the second side b will be referred to as a first angle α, an internal angle formed by the first side a and the third side c will be referred to as a second angle β, and an internal angle formed by the second side b and the third side c will be referred to as a third angle γ.

For example, the first side a may be located to correspond to or face an edge at which the second side b and the third side c meet, the second side b may be located to correspond to or face an edge at which the first side a and the third side c meet, and the third side c may be located to correspond to or face an edge at which the first side a and the second side b meet.

Hereinafter, the first to third sides a, b, and c and the first to third angles α, β, and γ for maximizing an area of the side surface of the semiconductor device 200A by maximizing the perimeter length of the semiconductor device 200A will be described with reference to FIG. 18.

Figure 18:
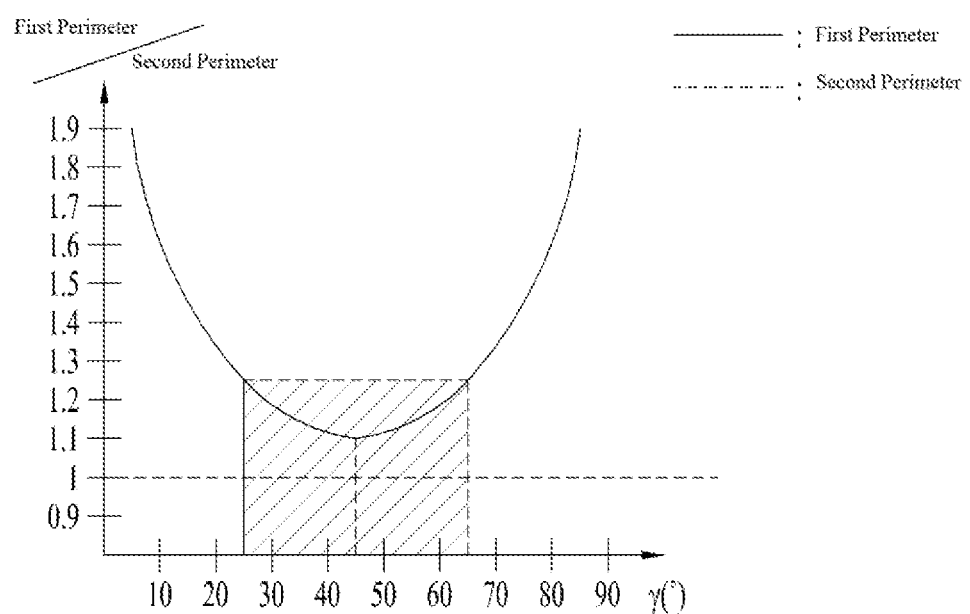
FIG. 18 is a graph illustrating the ratio of a first perimeter to a second perimeter according to at least one angle of the semiconductor device of FIG. 15.

FIG. 18 is a graph illustrating the ratio of a first perimeter to a second perimeter according to at least one angle of the semiconductor device 200A of the embodiment.

Referring to FIG. 18, when the planar shape of the cross-section or upper surface of the semiconductor device 200A of the embodiment is a right triangle, the area of the upper surface of the semiconductor device 200A is referred to as S and the perimeter of the side surface of the semiconductor device 200A is referred to as a first perimeter.

For example, the first perimeter may be the sum of lengths of the first to third sides a, b, and c of the upper surface of the semiconductor structure 1130 of the semiconductor device 200A.

When the planar shape of the cross-section or upper surface of the semiconductor device 200A of the embodiment is a right triangle, the lengths of the first to third sides a, b, and c may satisfy the equation $M^2+N^2=P^2$.

In the above equation, M may denote the length of the first side a, N may denote the length of the second side b, and P may denote the length of the third side c.

When the planar shape of the cross-section or upper surface of the semiconductor device 200A of the embodiment is an equilateral triangle, the area of the semiconductor device 200A is referred to as S and the perimeter of the semiconductor device 200A is referred to as a second perimeter.

The first perimeter and second perimeter are defined on the premise that the areas of the cross section and upper surface of the semiconductor device are the same.

In the graph shown in FIG. 18, the x axis may be any one (e.g., γ) of at least two angles (e.g., β and γ) except for a right angle (e.g., α) among the first to third angles α, β, and γ and the y axis denotes the ratio of the first perimeter to the second perimeter (e.g., first perimeter/second perimeter).

The first angle α of the semiconductor device 200A of the embodiment may be 80° to 100°.

The sum of the second angle β and the third angle γ may be 80° to 100°.

As the second angle β or the third angle γ varies, the lengths M, N, and P of the first to third sides a, b, and c may vary. FIG. 18 illustrates the ratio of the first perimeter to the second perimeter.

As shown in FIG. 18, it can be appreciated that the ratio of the first perimeter to the second perimeter (first perimeter/second perimeter) is greater than 1 and, therefore, the first perimeter of a right triangle is greater than the second perimeter of an equilateral triangle given the same area.

Assuming that the height of the semiconductor device 200A of the embodiment is constant, it can be understood that the light extraction efficiency of the semiconductor device 200A of the embodiment is proportional to the perimeter of the semiconductor device 200A as described above.

For example, as the first perimeter increases based on the second perimeter, the area of the side surface of the semiconductor device 1100A becomes wide and thus light extraction efficiency increases.

In summary, in the semiconductor device 200A having a volume light emitter structure, since light is mainly emitted through the side surface, there is a correlation between the area of the side surface of the semiconductor device 200A and the light extraction efficiency of the semiconductor device 200A.

Notably, since the area of the active layer 1134 from which light is emitted according to the volume of the semiconductor device 200A differs, the semiconductor device 200A of the embodiment having the same volume, i.e., the semiconductor device 200A having the same height H and the same area S of the cross section, may increase light extraction efficiency by maximizing the perimeter of the cross section thereof.

Referring to the graph shown in FIG. 18, as the magnitude of the second angle β or the third angle γ increases, the first perimeter increases and thus the light extraction efficiency increases. However, the second angle β or the third angle γ of the embodiment may be provided with the magnitude of 25° to 65°. If the magnitude of the second angle β or the third angle γ is less than 25° or exceeds 65°, a current spreading effect may decrease and the light extraction efficiency may be reduced because a sufficient space for disposing the first electrode or the second electrode may not be secured.

As shown in FIG. 18, the ratio of the first perimeter to the second perimeter (first perimeter/second perimeter) of the semiconductor device according to the embodiment given the same area may be 1.1 to 1.25.

When the ratio of the first perimeter to the second perimeter (first perimeter/second perimeter) exceeds 1.25, the current spreading effect may be reduced and the light extraction efficiency may be reduced because a sufficient space for disposing the first electrode or second electrode may not be secured.

A description of the shape of the semiconductor structure, the first angle α, the second angle β, or the third angle γ, and the ratio of the first perimeter to the second perimeter, given with respect to FIGS. 15 to 18, may be equally applied to the embodiments 100 and 200 described with respect to FIGS. 1 to 10.

The semiconductor device package according to the embodiments may be arrayed on a substrate with a plurality of semiconductor device packages. A light guide plate, a prism sheet, or a diffusion sheet, which is an optical member of the semiconductor device package, may be disposed on a light path. The semiconductor device package, the substrate, or the optical member may function as a backlight unit.

Another embodiment may be implemented as a display apparatus, an indication apparatus, or a lighting system, including the semiconductor device or semiconductor device package described in the above-described embodiments. For example, the lighting apparatus may include a lamp, a streetlamp, and a head lamp.

Figure 21:
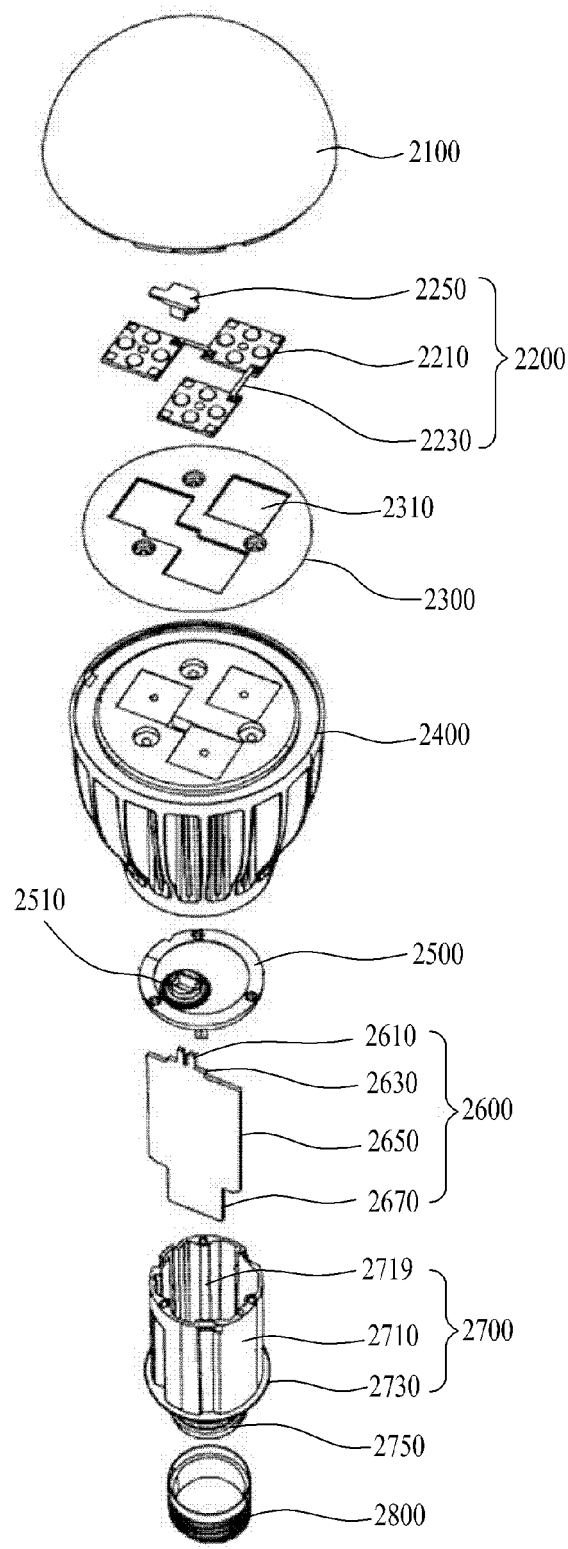
FIG. 21 illustrates a lighting apparatus according to an embodiment.

FIG. 21 illustrates a lighting apparatus according to an embodiment.

Referring to FIG. 21, the lighting apparatus may include a cover 2100, a light source module 2200, a heat sink 2400, a power supply unit 2600, an inner case 2700, and a socket 2800. The lighting apparatus according to the embodiment may further include any one or more of a member 2300 and a holder 2500.

The cover 2100 may have a hollow bulbous or hemispherical shape, a portion thereof is open. The cover 2100 may be optically coupled to the light source module 2200. For example, the cover 2100 may diffuse, scatter, or excite light emitted from the light source module 2200. The cover 2100 may be a sort of optical member. The cover 2100 may be coupled to the heat sink 2400. The cover 2100 may have a coupling portion coupled to the heat sink 2400.

The inner surface of the cover 2100 may be coated with a milky white paint. The milky white paint may include a light diffusion material for diffusing light. The roughness of the inner surface of the cover 2100 may be greater than the roughness of the outer surface of the cover 2100. This serves to sufficiently scatter and diffuse light emitted from the light source module 2200 so that light is released to the outside.

The cover 2100 may be formed of glass, plastic, polypropylene (PP), polyethylene (PE), or polycarbonate (PC). Herein, PC has excellent light resistance, heat resistance and strength. The cover 2100 may be transparent so as to view the light source module 2200 from the outside. However, embodiments are not limited thereto and the cover 2100 may be opaque. The cover 2100 may be formed through blow molding.

The light source module 2200 may be disposed on one surface of the heat sink 2400. Heat generated by the light source module 2200 may be conducted to the heat sink 2400. The light source module 2200 may include light source units 2210, connection plates 2230, and a connector 2250. The light source unit 2210 may include the semiconductor device 100, 200, 1100A, 1100B, or 200A or the semiconductor device package 600 or 1200 according to the embodiments.

The member 2300 may be disposed on the upper surface of the heat sink 2400 and include guide grooves 2310 into which the light source units 2210 and the connector 2250 are inserted. The guide grooves 2310 may correspond to or align with substrates of the light source units 2210 and the connector 2250.

A light reflective material may be applied to or coated on the surface of the member 2300.

For example, a white paint may be applied to or coated on the surface of the member 2300. The member 2300 reflects light, which has been reflected by the inner surface of the cover 2100 and has returned toward the light source module 1200, in the direction to the cover 2100 again, thereby improving luminous efficiency of the lighting apparatus according to the embodiment.

The member 2300 may be formed of an insulating material. The connection plate 2230 of the light source module 2200 may include an electrically conductive material, by which electrical connection between the heat sink 2400 and the connection plate 2230 may be made. The member 2300 may be formed of an insulating material for cutting off electrical short between the connection plate 2230 and the heat sink 2400. The heat sink 2400 receives heat from the light source module 2200 and the power supply unit 2600 and dissipates the heat.

The holder 2500 covers a reception groove 2719 of an insulating portion 2710 of the inner case 2700. Therefore, the power supply unit 2600 received in the insulating portion 2710 of the inner case 2700 is hermetically sealed. The holder 2500 has a guide protrusion 2510. The guide protrusion 2510 may have a hole through which a protrusion 2610 of the power supply unit 2600 passes.

The power supply 2600 processes or converts an external electrical signal and supplies the processed or converted signal to the light source module 2200. The power supply 2600 is received in the reception groove 2719 of the inner case 2700 and is hermetically sealed in the inner case 2700 by the holder 2500. The power supply unit 2600 may include a guide 2630, a base 2650, and an extension portion 2670 in addition to the protrusion 2610.

The guide 2630 is formed in a shape protruding outward from one side of the base 2650. The guide 2630 may be inserted into the holder 2500. A plurality of components may be disposed on one surface of the base 2650. The components may include a direct current (DC) converter for converting alternating current (AC) power supplied from an external power source into DC power, a drive chip for controlling driving of the light source module 2200, and an electrostatic discharge (ESD) protection device for protecting the light source module 2200. However, embodiments are not limited thereto.

The extension portion 2670 is formed in a shape protruding outward from the other side of the base 2650. The extension portion 2670 may be inserted into a connection part 2750 of the inner case 1700 for receiving an external electrical signal. For example, the extension portion 2670 may have a width equal to or less than that of the connection part 2750 of the inner case 2700. One end of a positive (+) cable and one end of a negative (−) cable may be electrically connected to the extension portion 2670 and the other end of the positive (+) cable and the other end of the negative cable (−) may be electrically connected to the socket 1800.

A molding portion may be disposed in the inner case 2700 in addition to the power supply unit 2600. The molding portion, which is formed by solidifying molding liquid, serves to fix the power supply unit 1600 within the inner case 2700.

Figure 22:
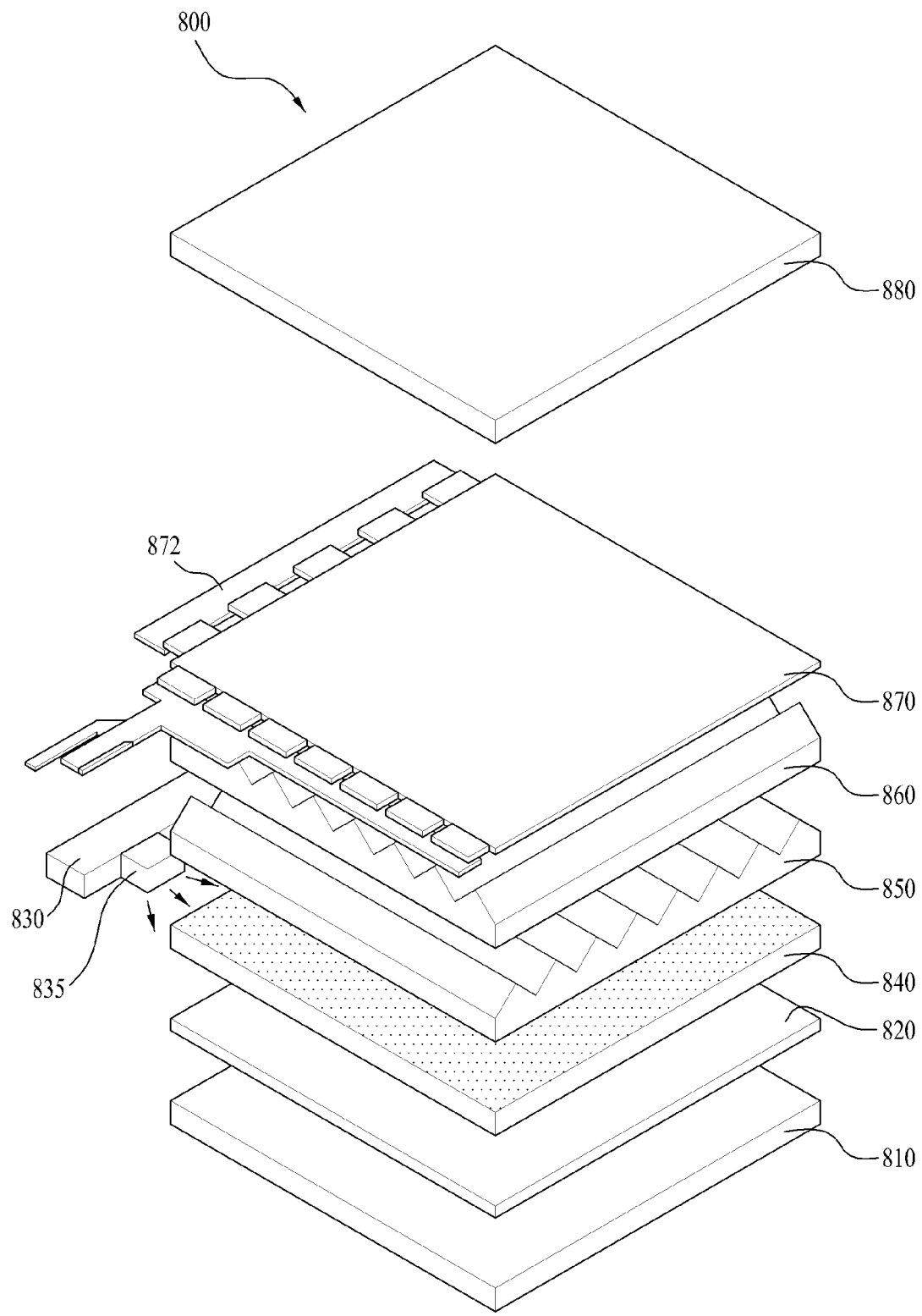
FIG. 22 illustrates a display apparatus according to an embodiment.

FIG. 22 illustrates a display apparatus 800 according to an embodiment.

Referring to FIG. 22, the display apparatus 800 may include a bottom cover 810, a reflective plate 820 disposed on the bottom cover 810, light emitting modules 830 and 835 for emitting light, a light guide plate 840 which is disposed in front of the reflective plate 820 and guides light emitted from the light emitting modules 830 and 835 to the display apparatus in a forward direction, an optical sheet including prism sheets 850 and 860 disposed in front of the light guide plate 840, a display panel 870 disposed in front of the optical sheet, an image signal output circuit 870 which is connected to the display panel 870 and supplies an image signal to the display panel 870, and a color filter 880 disposed in front of the display panel 870. Herein, the bottom cover 810, the reflective plate 820, the light emitting modules 830 and 835, the light guide plate 840, and the optical sheet may constitute a backlight unit.

The light emitting module may include light emitting device packages 835 mounted on the substrate 830. The substrate 830 may be a PCB or the like. The light emitting device package 835 may be the above-described embodiment 600 or 1200.

The bottom cover 810 may receive constituent elements of the display apparatus 800. The reflective plate 820 may be provided as a separate element as shown in the drawing or may be provided by coating the rear surface of the light guide plate 840 or the front surface of the bottom cover 810 with a material having high reflectivity.

The reflective plate 820 may be formed of a material having high reflectivity and an ultra-thin shape. Polyethylene terephthalate (PET) may be used as the reflective plate 820.

The light guide plate 840 may be formed of polymethylmethacrylate (PMMA), polycarbonate (PC), or polyethylene (PE).

The first prism sheet 850 may be formed of a light transmissive polymer having elasticity on one surface of a support film. The polymer may have a prism layer provided with a plurality of repeatedly formed three-dimensional structures. The plural structures may be provided in stripes having ridges and valleys repeated therein, as shown in the drawing.

A direction of ridges and valleys formed on one surface of a support film of the second prism sheet 860 may be perpendicular to a direction of the ridges and valleys on one surface of the support film of the first prism sheet 850. This serves to evenly distribute light transmitted from the light emitting module and the reflective plate in all directions of the display panel 1870.

Although not illustrated, a diffusion sheet may be located between the light guide plate 840 and the first prism sheet 850. The diffusion sheet may be formed of any one of polyester and polycarbonate based materials and may maximize a light projection angle via refraction and scattering of light introduced from the backlight unit. The diffusion sheet may include a support layer containing a light diffuser, and first and second layers which are formed respectively on the light emitting surface (in a direction of the first prism sheet) and the light introduction surface (in a direction of the reflective sheet) and do not include light diffusers.

In the embodiment, the diffusion sheet, the first prism sheet 850, and the second prism sheet 860 constitute the optical sheet. The optical sheet may include other combinations, for example, a micro-lens array, a combination of a diffusion sheet and a micro-lens array, or a combination of a single prism sheet and a micro-lens array.

The display panel 870 may be a liquid crystal display panel. In addition to the liquid crystal display panel 860, the display panel 870 may be any one of various other kinds of display apparatuses requiring light sources.

The semiconductor device according to the embodiment may be a laser diode. The laser diode may include a first conductivity-type semiconductor layer, an active layer, and a second conductivity-type semiconductor layer, having the above-described structures, similarly to the above light emitting element.

For example, the semiconductor device according to the embodiment may be a photodetector. The photodetector may include a (silicon or selenium) optical cell, a (cadmium sulfide or cadmium selenium) photoconductive element, a photodiode (PD) (e.g., a PD having a peak wavelength in a visible blind spectral region or a true blind spectral region), a phototransistor, a photo multiplier, a photoelectric tube (vacuum or encapsulation of gas), or an infrared (IR) detector. However, embodiments are not limited thereto.

The semiconductor device according to the embodiment is not necessarily implemented as a semiconductor and may further include a metallic material according to occasions. For example, a semiconductor device such as a light receiving element may be implemented by at least one of Ag, Al, Au, In, Ga, N, Zn, Se, P, or As and may also be implemented by a semiconductor material doped with a p-type or n-type dopant or an intrinsic semiconductor material.

Features, structures, effects, and the like associated with the embodiments described above are incorporated into at least one embodiment of the present disclosure, but are not limited to only one embodiment.

Furthermore, features, structures, effects, and the like exemplified associated with respective embodiments can be implemented in other embodiments by combination or modification by those skilled in the art. Therefore, contents related to such combinations and modifications should be construed as falling within the scope of the present disclosure.

The embodiments may be used for a semiconductor device capable of improving a heat dissipation effect and preventing deterioration of luminous efficiency caused by increase in temperature.

The invention claimed is:

1. A semiconductor device comprising:
a semiconductor substrate;
a pattern layer disposed on the semiconductor substrate, the pattern layer including a plurality of patterns separated from each other;
a nitride semiconductor layer disposed on the pattern layer; and
a semiconductor structure disposed on the nitride semiconductor layer and comprising a first conductivity-type semiconductor layer, a second conductivity-type semiconductor layer, and an active layer disposed between the first conductivity-type semiconductor layer and the second conductivity-type semiconductor layer;
a first electrode electrically connected to the first conductivity-type semiconductor layer; and
a second electrode electrically connected to the second conductivity-type semiconductor layer,
wherein the plurality of patterns are disposed inside the nitride semiconductor layer,
wherein the plurality of patterns extend in a vertical direction from a top surface of the semiconductor substrate towards the semiconductor structure disposed on the nitride semiconductor layer, and
wherein a width of a corresponding pattern decreases in the vertical direction.

2. The semiconductor device according to claim 1, wherein a planar shape of an upper surface of the semiconductor structure is a triangle having a first side, a second side, and a third side, an angle between the first side and the second side is a first angle, an angle between the first side and the third side is a second angle, and an angle between the second side and the third side is a third angle,
wherein the second or third angle is between 25° to 65°, and
wherein the active layer emits ultraviolet wavelength light having a wavelength of 100 nm to 400 nm.

3. The semiconductor device according to claim 2, wherein the triangle is a right triangle or an equilateral triangle, and a ratio of a first perimeter of the right triangle to a second perimeter of the equilateral triangle is 1.1 to 1.25.

4. The semiconductor device according to claim 1, wherein a shape of an upper surface of the semiconductor structure is a triangle.

5. The semiconductor device according to claim 1, wherein the pattern layer is an aluminum nitride (AlN) layer.

6. The semiconductor device according to claim 5, wherein the plurality of patterns have stripe shapes, a width of each of the plurality of patterns is 10 μm to 20 μm, and a distance between the plurality of patterns is 2 μm to 4 μm.

7. The semiconductor device according to claim 6, wherein an area occupied by the pattern layer relative to an entire area of the upper surface of the semiconductor substrate is 70% or more.

8. The semiconductor device according to claim 7, wherein the area occupied by the pattern layer relative to the entire area of the upper surface of the semiconductor substrate is 95% or less.

9. The semiconductor device according to claim 5, wherein each of the plurality of patterns has a discoid shape or a polyhedral shape, a diameter of each of the plurality of patterns is 2 μm to 5 μm, and a distance between the plurality of patterns is 0.4 μm to 1.5 μm.

10. The semiconductor device according to claim 5, wherein the pattern layer includes a light transmissive insulating material.

11. The semiconductor device according to claim 5, wherein the pattern layer includes first to n-th patterns from a center of the semiconductor substrate to an edge of the semiconductor substrate, each of the first to n-th patterns has a ring shape, and an (n−1)-th pattern is disposed at an upper surface of the semiconductor substrate located inside an inner circumference surface of the n-th pattern.

12. The semiconductor device according to claim 11, wherein a shape of an outer circumferential surface of each of the first to n-th patterns is the same as a shape of an outer circumferential surface of the semiconductor substrate.

13. The semiconductor device according to claim 11, wherein a shortest distance of each of the first to n-th patterns from the center of the semiconductor substrate in a direction of the edge of the semiconductor substrate increases, and
wherein the shortest distance is a shortest separated distance from the center of the semiconductor substrate to the outer circumferential surface of each of the first to n-th patterns.

14. The semiconductor device according to claim 11, wherein a diameter of each of the first to n-th patterns is 2 μm to 5 μm, and a distance between the first to n-th patterns is 0.4 μm to 1.5 μm.

15. The semiconductor device according to claim 5, wherein the semiconductor structure includes a region exposing the first conductivity-type semiconductor layer, and the first electrode is connected to the exposed region of the conductivity-type semiconductor layer.

16. The semiconductor device according to claim 15, wherein the first electrode has a triangular shape and the second electrode has a trapezoidal shape.

17. The semiconductor device according to claim 5, wherein a thickness of the pattern layer is 0.5 μm to 3 μm.

18. The semiconductor device according to claim 5, wherein a height from a lower surface of the semiconductor substrate to an upper surface of the second conductivity-type semiconductor layer is 60 μm to 300 μm.

19. A semiconductor device package comprising:
a package body:
first and second lead frames disposed on the package body; and
a semiconductor device according to claim 1, the semiconductor device electrically connected to the first and second lead frames.

20. A semiconductor device comprising:
a semiconductor substrate having a shape of a triangular prism;
a pattern layer disposed on the semiconductor substrate, the pattern layer including first to n-th patterns separated from each other from a center of the semiconductor substrate to an edge of the semiconductor substrate;
a nitride semiconductor layer disposed on the pattern layer and having a shape of a triangular prism; and
a semiconductor structure disposed on the nitride semiconductor layer, the semiconductor structure including a first conductivity-type semiconductor layer, an active layer, and a second conductivity-type semiconductor layer and having a shape of a triangular prism,
wherein a planar shape of an upper surface of the semiconductor structure is a triangle having a first side, a second side, and a third side, an angle between the first side and the second side is a first angle, an angle between the first side and the third side is a second angle, and an angle between the second side and the third side is a third angle, the first angle being a right angle, and the second or third angle being between 25° to 65°,
wherein each of the first to n-th patterns has a ring shape, and an (n−1)-th pattern is disposed at an upper surface of the semiconductor substrate located inside an inner circumference surface of the n-th pattern, and
wherein the first to n-th patterns are disposed inside the nitride semiconductor layer.

* * * * *